(12) United States Patent
Futami et al.

(10) Patent No.: US 12,342,628 B2
(45) Date of Patent: Jun. 24, 2025

(54) SEMICONDUCTOR STORAGE DEVICE

(71) Applicant: KIOXIA CORPORATION, Tokyo (JP)

(72) Inventors: Yukihisa Futami, Yokohama Kanagawa (JP); Yasuhiro Hegi, Kawasaki Kanagawa (JP); Kenichi Kawabata, Chigasaki Kanagawa (JP); Tsuyoshi Etou, Yokohama Kanagawa (JP); Haruyuki Miyata, Ayase Kanagawa (JP); Kenichi Sugawara, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 710 days.

(21) Appl. No.: 17/459,903

(22) Filed: Aug. 27, 2021

(65) Prior Publication Data

US 2022/0302106 A1    Sep. 22, 2022

(30) Foreign Application Priority Data

Mar. 17, 2021    (JP) .................. 2021-043719

(51) Int. Cl.
| | |
|---|---|
| *H10D 89/60* | (2025.01) |
| *H03H 1/02* | (2006.01) |
| *H10B 41/27* | (2023.01) |
| *H10B 41/41* | (2023.01) |

(Continued)

(52) U.S. Cl.
CPC ............. *H10D 89/911* (2025.01); *H03H 1/02* (2013.01); *H10B 41/27* (2023.02); *H10B 41/41* (2023.02); *H10B 43/27* (2023.02); *H10B 43/40* (2023.02); *H10D 89/60* (2025.01)

(58) Field of Classification Search
CPC ...... H10D 89/911; H10D 89/60; H10B 41/27; H10B 41/41; H10B 43/27; H10B 43/40; H01L 23/60; H01L 23/62; H01L 27/0248; H01L 27/0288
See application file for complete search history.

(56) References Cited

U.S. PATENT DOCUMENTS

| | | | |
|---|---|---|---|
| 2020/0091069 A1 | 3/2020 | Umezawa | |
| 2021/0327837 A1* | 10/2021 | Yoon | ........ H10B 43/40 |
| 2022/0165688 A1* | 5/2022 | Smith | ........ H10B 43/27 |

FOREIGN PATENT DOCUMENTS

JP    2020-047644 A    3/2020

* cited by examiner

*Primary Examiner* — Ratisha Mehta
*Assistant Examiner* — Brad A Knudson
(74) *Attorney, Agent, or Firm* — Kim & Stewart LLP

(57) ABSTRACT

A semiconductor storage device includes a memory cell array and a peripheral circuit disposed at least partially below the memory cell array. The peripheral circuit includes an RC circuit in which a resistive portion and a capacitive portion are electrically connected to each other in series. The resistive portion includes first and second lower conductors at a level that is below the memory cell array, an upper conductor at a level that is above the memory cell array, a first contact that connects the first lower conductor to the upper conductor, and a second contact that connects the upper conductor to the second lower conductor. The first lower conductor, the first contact, the upper conductor, the second contact, and the second lower conductor are electrically connected in series in this order and the first lower conductor is closest to the capacitive portion.

18 Claims, 15 Drawing Sheets

(51) Int. Cl.
*H10B 43/27* (2023.01)
*H10B 43/40* (2023.01)

SEMICONDUCTOR STORAGE DEVICE

CROSS-REFERENCE TO RELATED APPLICATION(S)

This application is based upon and claims the benefit of priority from. Japanese Patent Application No. 2021-043719, filed on Mar. 17, 2021, the entire contents of which are incorporated herein by reference.

FIELD

Embodiments described herein relate generally to a semiconductor storage device.

BACKGROUND

A semiconductor storage device such as a NAND-type flash memory includes, for example, peripheral circuits including a transistor or an RC circuit, as well as a memory array that stores data. Some semiconductor storage devices have a configuration where a part or all of the peripheral circuits are arranged at a position directly below the memory cell array, that is, at a position between the memory cell array and a semiconductor substrate.

DETAILED DESCRIPTION

Figure 1:
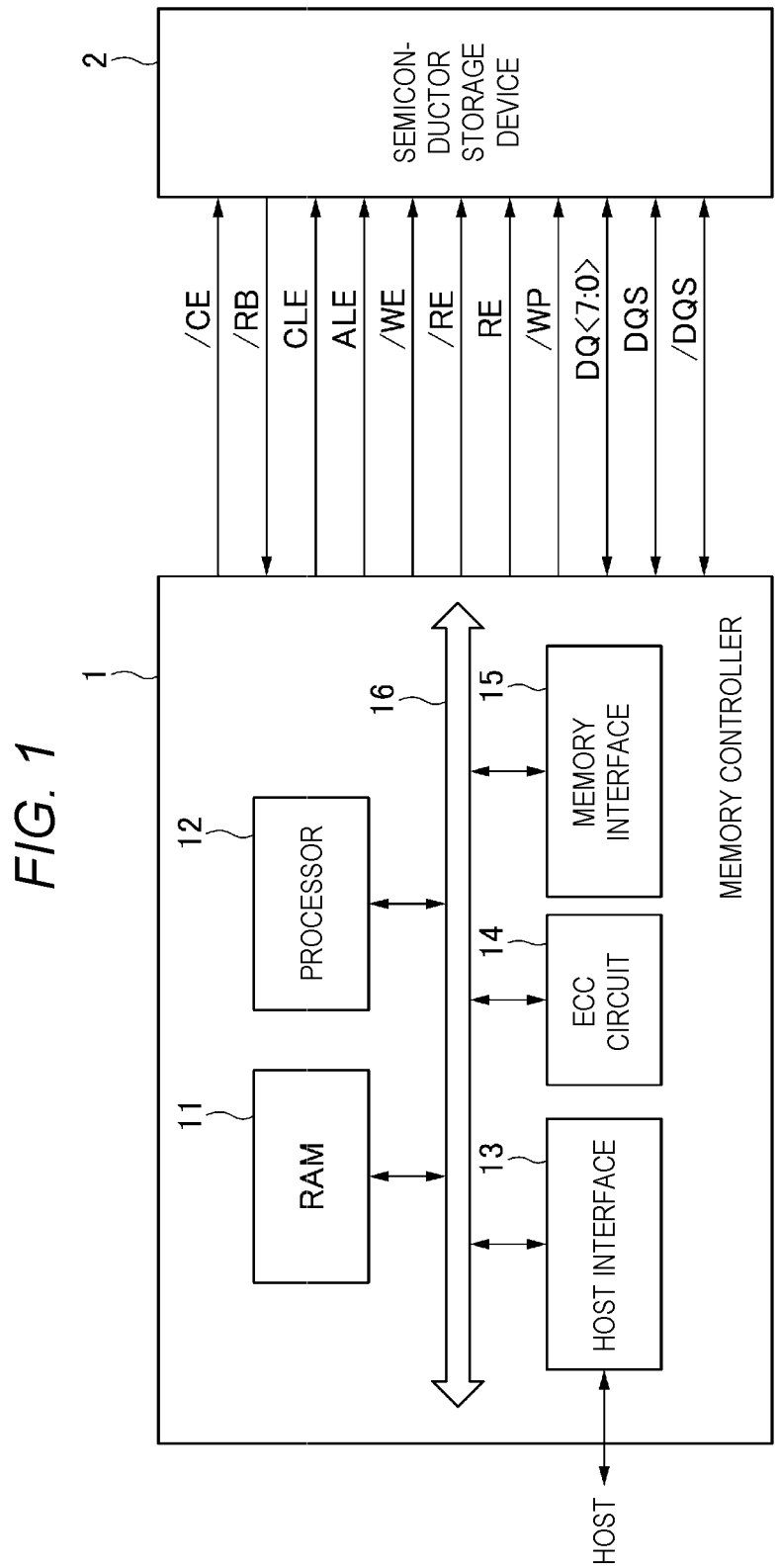
FIG. 1 is a block diagram illustrating a configuration example of a memory system according to a first embodiment.

Embodiments reduce the size of a semiconductor storage device by reducing a size of an RC circuit contained therein. Accordingly, embodiments provide a semiconductor storage device whose size may be made smaller than before.

In general, according to one embodiment, a semiconductor storage device includes a memory cell array and a peripheral circuit disposed at least partially below the memory cell array. The peripheral circuit includes an RC circuit in which a resistive portion and a capacitive portion are electrically connected to each other in series. The resistive portion includes first and second lower conductors at a level that is below the memory cell array, an upper conductor at a level that is above the memory cell array, a first contact that extends upward from the first lower conductor and connects the first lower conductor to the upper conductor, and a second contact that extends downward from the upper conductor and connects the upper conductor to the second lower conductor. The first lower conductor, the first contact, the upper conductor, the second contact, and the second lower conductor are electrically connected in series in this order and the first lower conductor is closest to the capacitive portion along a current path formed by the capacitive portion and the resistive portion.

Hereinafter, the present embodiment will be described with reference to the accompanying drawings. In order to facilitate understanding of descriptions, the same constituent elements in the drawings are marked with the same reference numerals as much as possible, and redundant descriptions thereof will be omitted.

A first embodiment will be described. A semiconductor storage device 2 according to the present embodiment is a non-volatile storage device configured as a NAND-type flash memory. FIG. 1 illustrates a block diagram of a configuration example of a memory system including the semiconductor storage device 2. This memory system includes a memory controller 1, and the semiconductor storage device 2. A plurality of semiconductor storage devices 2 are provided in the actual memory system, but only one of the semiconductor storage devices is illustrated in FIG. 1. The specific configuration of the semiconductor storage device 2 will be described later. This memory system may be connected to a host (not illustrated). The host is, for example, electronic equipment such as a personal computer or a mobile terminal.

The memory controller 1 controls writing of data into the semiconductor storage device 2 in response to a write request from the host. The memory controller 1 controls reading of data from the semiconductor storage device 2 in response to a read request from the host.

Between the memory controller 1 and the semiconductor storage device 2, a signal, such as a chip enable signal /CE, a ready busy signal /RB, a command latch enable signal CLE, an address latch enable signal ALE, a write enable signal /WE, read enable signals /RE and RE, a write protect signal /WP, a data signal DQ<7:0>, or data strobe signals DQS and /DQS, is transmitted/received.

The chip enable signal /CE is a signal for enabling the semiconductor storage device 2. The ready busy signal /RB is a signal for indicating whether the semiconductor storage device 2 is in a ready state or a busy state. The "ready state" is a state where a command can be accepted from the outside. The "busy state" is a state where a command cannot be accepted from the outside. The command latch enable signal CLE is a signal indicating that the signal DQ<7:0> is a command. The address latch enable signal ALE is a signal indicating that the signal DQ<7:0> is an address. The write enable signal /WE is a signal for inputting a received signal into the semiconductor storage device 2. In a single data rate (SDR) mode, an instruction is made so as to input the signal DQ<7:0> as a command, an address, or data transmitted to the semiconductor storage device 2 at a rising edge of the signal /WE. In a double data rate (DDR) mode, an instruction is made so as to input the signal DQ<7:0> as a command or an address transmitted to the non-volatile memory 2 at the rising edge of the signal /WE. The write enable signal /WE is asserted whenever a command, an address, or data is input into the semiconductor storage device 2 by the memory controller 1.

The read enable signal /RE is a signal that causes the memory controller 1 to read data from the semiconductor storage device 2. The signal RE is a complementary signal of the signal /RE. These signals are used for controlling an operation timing of the semiconductor storage device 2 when, for example, the signal DQ<7:0> is output. More specifically, in a single data rate mode, an instruction is made so as to output the signal DQ<7:0> as data to the non-volatile memory 2 at the falling edge of the signal /RE. In a double data rate mode, an instruction is made so as to output the signal DQ<7:0> as data to the non-volatile memory 2 at the falling edge and the rising edge of the signal /RE. The write protect signal /WP is a signal for instructing the semiconductor storage device 2 to prohibit writing and erasure of data. The signal DQ<7:0> is transmitted/received between the semiconductor storage device 2 and the memory controller 1, and contains a command, an address, and data. The data strobe signal DQS is a signal for controlling the timings of input/output of the signal DQ<7:0>. The signal /DQS is a complementary signal of the signal DQS. More specifically, in a double data rate mode, an instruction is made so as to take the signal DQ<7:0> as data in the non-volatile memory 2 at the falling edge and the rising edge of the signal DQS. In the double data rate mode, the signal DQS is generated on the basis of the falling edge and the rising edge of the signal /RE, and is output together with the signal DQ<7:0> as data from the non-volatile memory 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request and user data (e.g., write data) received from the host, to the internal bus 16. The host interface 13 transmits user data read from the semiconductor storage device 2 and a response from the processor 12 to the host.

The memory interface 15 controls a process of writing user data into the semiconductor storage device 2, and a process of reading user data from the semiconductor storage device 2 on the basis of instructions of the processor 12.

The processor 12 performs an overall control of the memory controller 1. The processor 12 is, for example, a CPU or an MPU. When a request is received from the host via the host interface 13, the processor 12 performs a control according to the request. For example, the processor 12 instructs the memory interface 15 to write user data and a parity into the semiconductor storage device 2 according to a request from the host. The processor 12 instructs the memory interface 15 to read user data and a parity from the semiconductor storage device 2 according to a request from the host.

The processor 12 determines a storage area (also referred to as a memory area) on the semiconductor storage device 2 in regard to user data stored in the RAM 11. The user data is stored in the RAM 11 via the internal bus 16. The processor 12 performs a determination of a memory area, per page (page data) as a writing unit. Hereinafter, user data stored in one page of the semiconductor storage device 2 will be also referred to as "unit data." The unit data is generally encoded, and then is stored as a codeword in the semiconductor storage device 2. In the present embodiment, encoding is optional. The memory controller 1 may store the unit data in the semiconductor storage device 2 without encoding, but, FIG. 1 illustrates a configuration where encoding is performed, as a configuration example. When the memory controller 1 does not perform encoding, the page data is consistent with the unit data. One codeword may be generated on the basis of one unit data, or one codeword may be generated on the basis of divided data in the case where unit data is divided. Also, one codeword may be generated by using a plurality of unit data.

The processor 12 determines a memory area of the semiconductor storage device 2 as a write destination for each unit data. A physical address is allocated to the memory area of the semiconductor storage device 2. The processor 12 manages the memory area as the write destination of unit data by using the physical address. The processor 12 specifies the determined memory area (i.e., the physical address) and instructs the memory interface 15 to write user data into the semiconductor storage device 2. The processor 12 manages the correspondence between a logical address (e.g., a logical address managed by the host) and a physical address of user data. When a read request including a logical address is received from the host, the processor 12 specifies a physical address corresponding to the logical address, designates the physical address, and instructs the memory interface 15 to read user data.

The ECC circuit 14 encodes user data stored in the RAM 11 to generate a codeword. The ECC circuit 14 decodes a codeword read from the semiconductor storage device 2.

The RAM 11 temporarily stores user data received from the host until the user data is stored in the semiconductor storage device 2, or temporarily stores data read from the semiconductor storage device 2 until the data is transmitted to the host. The RAM 11 is, for example, a general purpose memory such as a SRAM or a DRAM.

FIG. 1 illustrates a configuration example in which the memory controller 1 includes each of the ECC circuit 14 and the memory interface 15. However, the ECC circuit 14 may be integrated with the memory interface 15. The ECC circuit 14 may be integrated with the semiconductor storage device 2. The specific configuration or the arrangement of each element illustrated in FIG. 1 is not limited to the configuration or arrangement depicted in FIG. 1.

When a write request is received from the host, the memory system of FIG. 1 operates as follows. The processor 12 temporarily stores write target data in the RAM 11. The processor 12 reads the data stored in the RAM 11, and inputs the data to the ECC circuit 14. The ECC circuit 14 encodes the input data to generate a codeword, and inputs the codeword to the memory interface 15. The memory interface 15 writes the input codeword into the semiconductor storage device 2.

When a read request is received from the host, the memory system of FIG. 1 operates as follows. The memory interface 15 inputs a codeword read from the semiconductor storage device 2, to the ECC circuit 14. The ECC circuit 14 decodes the input codeword, and stores the decoded data in the RAM 11. The processor 12 transmits the data stored in the RAM 11 to the host via the host interface 13.

Figure 2:
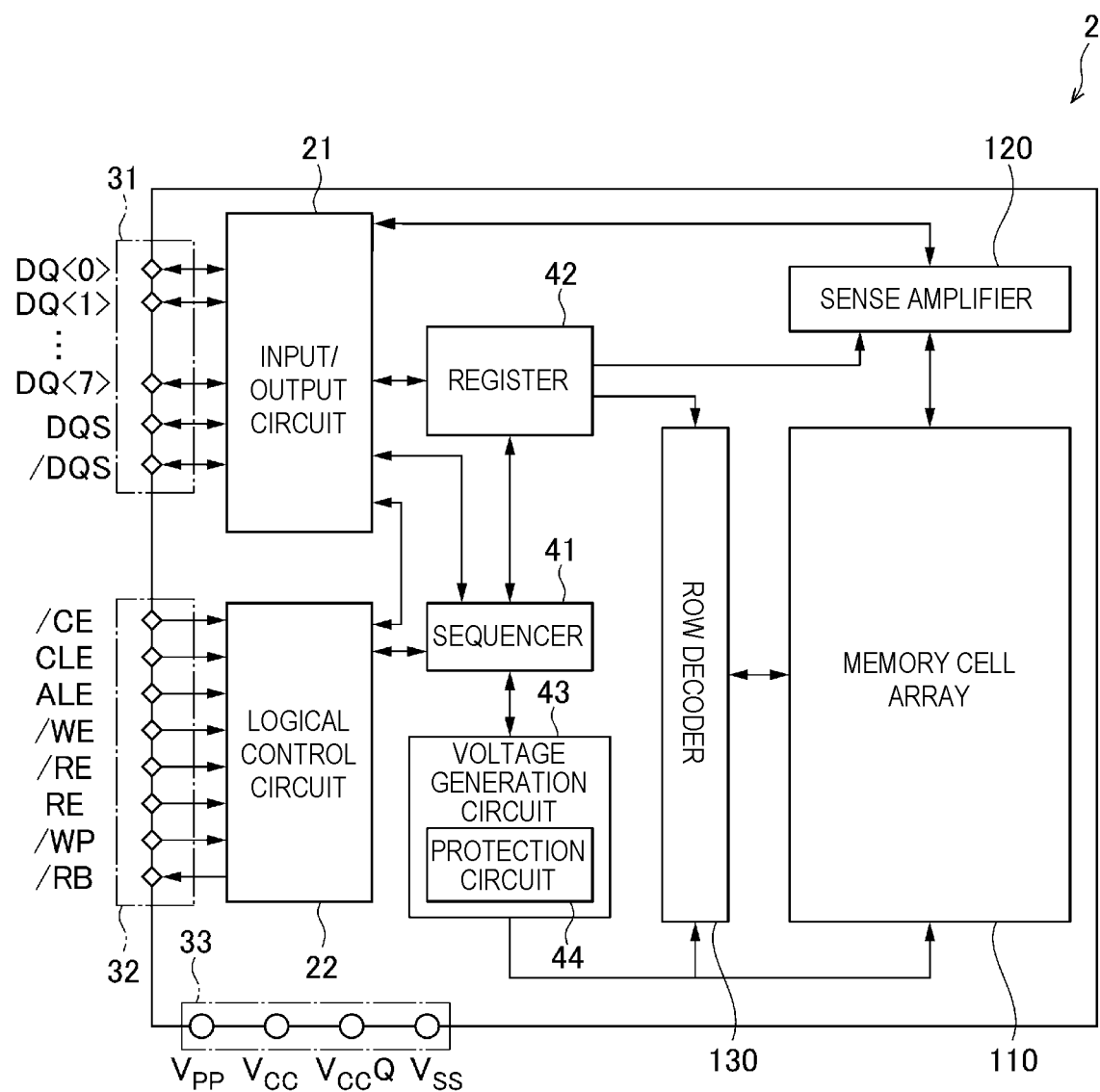
FIG. 2 is a block diagram illustrating the configuration of a semiconductor storage device according to the first embodiment.

The configuration of the semiconductor storage device will be described. As illustrated in FIG. 2, the semiconductor storage device 2 includes a memory cell array 110, a sense amplifier 120, a row decoder 130, an input/output circuit 21, a logical control circuit 22, a sequencer 41, a register 42, a voltage generation circuit 43, an input/output pad group 31, a logical control pad group 32, and a power input terminal group 33.

Figure 3:
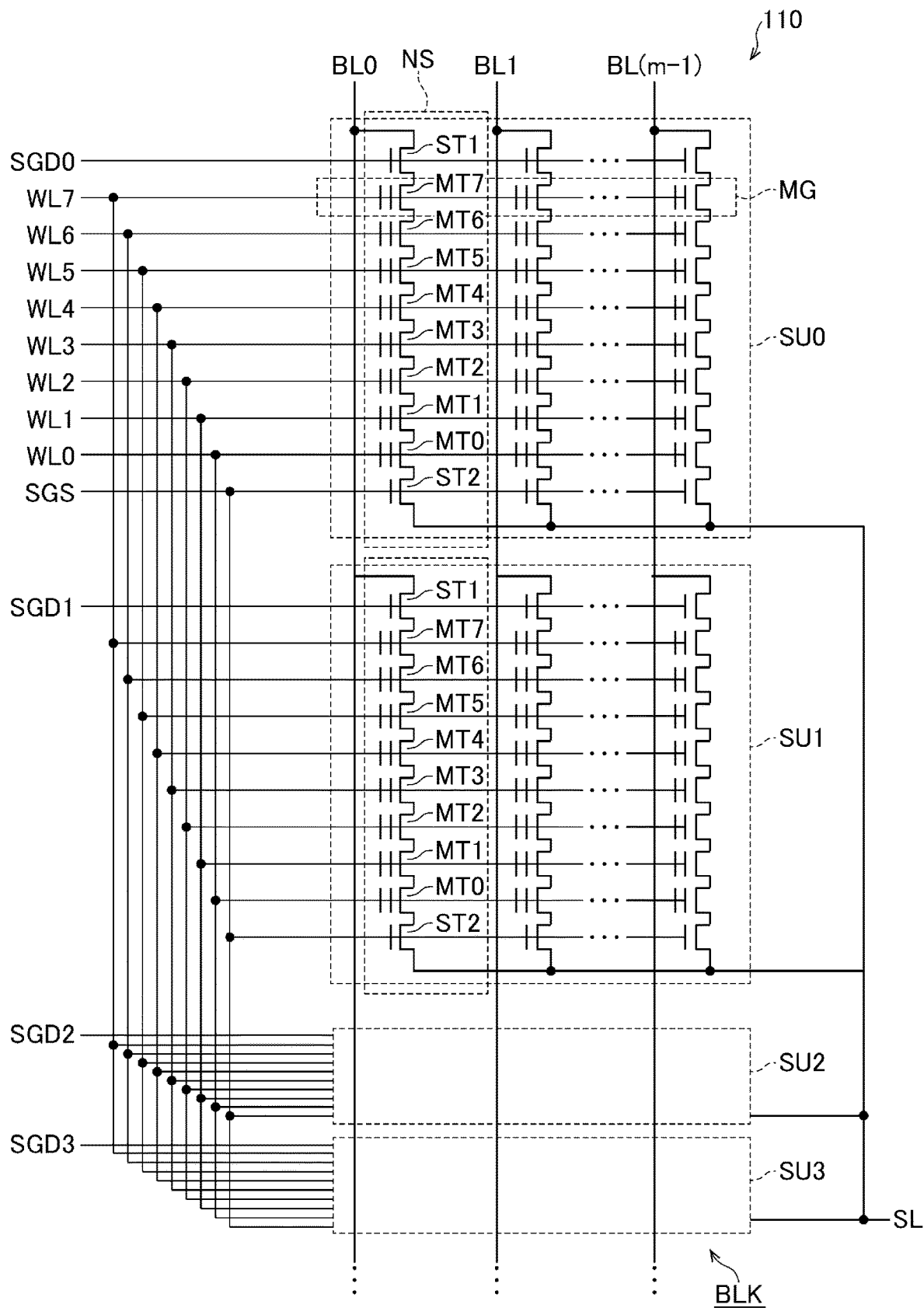
FIG. 3 is an equivalent circuit diagram illustrating the configuration of a memory cell array.

The memory cell array 110 stores data. FIG. 3 illustrates the configuration of the memory cell array 110 as an equivalent circuit diagram. The memory cell array 110 includes a plurality of blocks BLK, but, in FIG. 3, only one block BLK is illustrated. The configurations of other blocks BLK included in the memory cell array 110 are also the same as that illustrated in FIG. 3.

As illustrated in FIG. 3, the block BLK includes, for example, four string units SU (SU0 to SU3). Each string unit SU includes a plurality of NAND strings NS. Each NAND string NS includes, for example, eight memory cell transistors MT (MT0 to MT7) and select transistors ST1 and ST2.

The number of memory cell transistors MT is not limited to eight, and may be, for example, 32, 48, 64, or 96. For example, in order to improve the cut-off characteristics, each of the select transistors ST1 and ST2 may include a plurality of transistors instead of a single transistor. Further, a dummy cell transistor may be provided between the memory cell transistors MT and the select transistors ST1 and ST2.

The memory cell transistors MT are arranged to be connected in series between the select transistor ST1 and the select transistor ST2. On one end side, the memory cell transistor MT7 is connected to a source of the select transistor ST1, and on the other end side, the memory cell transistor MT0 is connected to a drain of the select transistor ST2.

Gates of the respective select transistors ST1 of the string units SU0 to SU3 are connected to select gate lines SGD0 to SGD3, respectively, in common. In the plurality of string units SU within the same block BLK, gates of the select transistors ST2 are connected to the same select gate line SGS in common. Control gates of the memory cell transistors MT0 to MT7 within the same block BLK are connected to word lines WL0 to WL7, respectively, in common. That is, the word lines WL0 to WL7 and the select gate line SGS are shared between the string units SU0 to SU3 within the same block BLK, whereas the select gate line SGD is individually provided for each of the string units SU0 to SU3 even within the same block BLK.

A number of bit lines BL (BL0, BL1, ..., BL(m−1)) are provided in the memory cell array 110. The number "m" is an integer indicating the number of NAND strings NS included in one string unit SU. In each NAND string NS, a drain of the select transistor ST1 is connected to a corresponding bit line BL. A source of the select transistor ST2 is connected to a source line SL. The source line SL is connected to sources of the plurality of select transistors ST2 included in the block BLK, in common.

Data stored in the plurality of memory cell transistors MT within the same block BLK are erased at once. Meanwhile, reading and writing of data are performed at the same time for a plurality of memory cell transistors MT connected to one word line WL and belonging to one string unit SU. Each memory cell is capable of storing 3 bits of data including a high-order bit, a middle-order bit, and a low-order bit.

That is, the semiconductor storage device 2 according to the present embodiment employs a TLC method of storing 3 bits of data in one memory cell transistor MT as a method of writing data into the memory cell transistors MT. Instead of such a mode, as a method of writing data into the memory cell transistors MT, an MLC method of storing 2 bits of data in one memory cell transistor MT or an SLC method of storing 1 bit of data in one memory cell transistor MT may be employed.

A set of 1-bit data stored in the plurality of memory cell transistors MT connected to one word line WL and belonging to one string unit SU is called a "page." In FIG. 3, a symbol "MG" is attached to one set including the above-described plurality of memory cell transistors MT.

As in the present embodiment, when 3 bits of data is stored in one memory cell transistor MT, a set of the plurality of memory cell transistors MT connected to a common word line WL within one string unit SU is capable of storing 3 pages of data.

Figure 4:
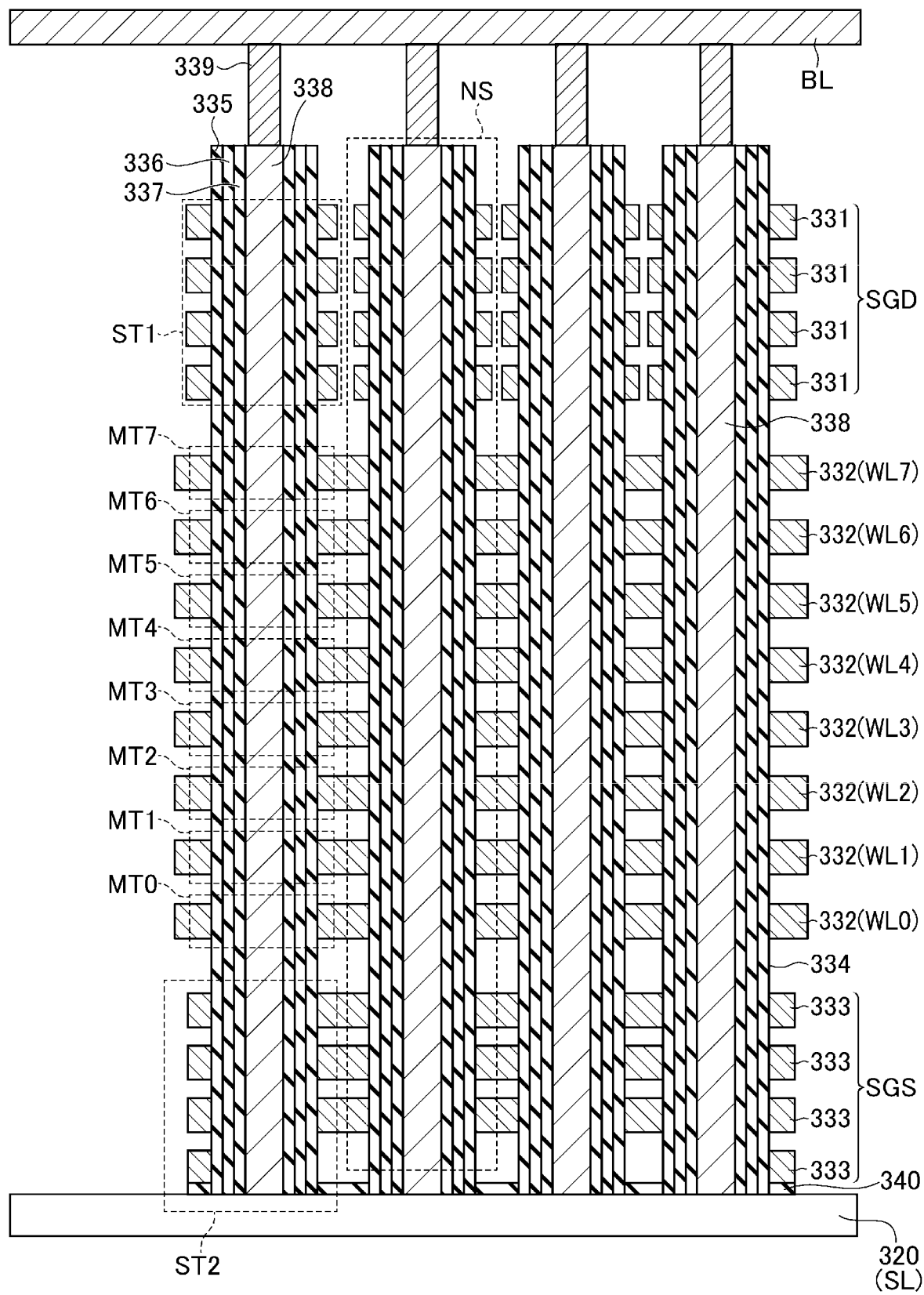
FIG. 4 is a sectional view illustrating the configuration of the memory cell array.

FIG. 4 illustrates the configuration of the memory cell array 110, in a schematic sectional view. As illustrated in the same drawing, in the memory cell array 110, a plurality of NAND strings NS is formed on a conductive layer 320. The conductive layer 320 is also referred to as an embedded source line, and corresponds to the source line SL of FIG. 3.

A plurality of wiring layers 333 functioning as the select gate line SGS, a plurality of wiring layers 332 functioning as the word lines WL, and a plurality of wiring layers 331 functioning as the select gate line SGD are stacked above the conductive layer 320. Insulating layers (not illustrated) are individually disposed between the stacked wiring layers 333, 332, and 331.

A plurality of memory holes 334 is formed in the memory cell array 110. The memory hole 334 is a hole that reaches the conductive layer 320 while vertically passing through the above wiring layers 333, 332, and 331, and the insulating layers (not illustrated) disposed between these wiring layers. On the side surface of the memory hole 334, a block insulating film 335, a charge storage layer 336, and a gate insulating film 337 are sequentially formed, and inside these, a conductive pillar 338 is further embedded. The conductive pillar 338 is made of, for example, polysilicon, and functions as a region where a channel is formed when the memory cell transistors MT and the select transistors ST1 and ST2 included in the NAND string NS operate. In this manner, inside the memory hole 334, a columnar body including the block insulating film 335, the charge storage layer 336, the gate insulating film 337, and the conductive pillar 338 is formed.

In the columnar body formed inside the memory hole 334, each portion intersecting each of the stacked wiring layers 333, 332, and 331 functions as a transistor. Among these transistors, those disposed at portions intersecting the wiring layers 331 function as the select transistor ST1. Among the transistors, those disposed at portions intersecting the wiring layers 332 function as the memory cell transistors MT (MT0 to MT7). Among the transistors, those disposed at portions intersecting the wiring layers 333 function as the select transistor ST2. Through such a configuration, each columnar body formed inside each memory hole 334 functions as the NAND string NS that has been described with reference to FIG. 3. The conductive pillar 338 disposed inside the columnar body is a portion functioning as a channel for the memory cell transistors MT or the select transistors ST1 and ST2.

A wiring layer functioning as the bit line BL is formed above the conductive pillar 338. A contact plug 339 that connects the conductive pillar 338 to the bit line BL is formed at the upper end of the conductive pillar 338.

The same configurations as the configuration illustrated in FIG. 4 are aligned along the depth direction of the paper surface of FIG. 4. One string unit SU is formed by the set including the NAND strings NS aligned in a plane that extends in the depth direction of the paper surface of FIG. 4.

Referring back to FIG. 2, explanation of the semiconductor storage device 2 is continued. The sense amplifier 120 is a circuit for adjusting a voltage applied to the bit line BL, or reading a voltage of the bit line BL and converting the voltage into data. At the time of data reading, the sense amplifier 120 acquires data from the memory cell transistor MT to the bit line BL, and transfers the acquired data to the input/output circuit 21. At the time of data writing, the sense amplifier 120 transfers write data via the bit line BL to the memory cell transistor MT. Operations of the sense amplifier 120 are controlled by the sequencer 41 to be described below.

The row decoder 130 is a circuit configured as a switch group (not illustrated) for applying voltages to the word lines WL, respectively. The row decoder 130 receives a block address and a row address from the register 42, and selects a corresponding block BLK on the basis of the corresponding block address while selecting a corresponding word line WL on the basis of the corresponding row address. The row decoder 130 switches opening and closing of the above switch group such that a voltage from the voltage generation circuit 43 is applied to the selected word line WL. Operations of the row decoder 130 are controlled by the sequencer 41.

The input/output circuit 21 transmits/receives signals DQ<7:0>, and data strobe signals DQS and /DQS to/from the memory controller 1. The input/output circuit 21 transfers a command and an address within the signals DQ<7:0> to the register 42. The input/output circuit 21 transmits/receives write data and read data to/from the sense amplifier 120.

The logical control circuit 22 receives a chip enable signal /CE, a command latch enable signal CLE, an address latch enable signal ALE, a write enable signal /WE, read enable signals /RE and RE, and a write protect signal /WP from the memory controller 1. The logical control circuit 22 transfers a ready busy signal /RB to the memory controller 1 to notify the outside of the state of the semiconductor storage device 2.

The sequencer 41 controls the operation of each of units including the memory cell array 110 on the basis of control signals input to the input/output circuit 21 and the logical control circuit 22 from the memory controller 1.

The register 42 is a portion that temporarily stores a command or an address. The register 42 stores a command for an instruction of a write operation, a read operation, or an erase operation. The corresponding command is input from the memory controller 1 to the input/output circuit 21, and then is transferred from the input/output circuit 21 to the register 42 and is stored.

The register 42 also stores an address corresponding to the above command. The corresponding address is input from the memory controller 1 to the input/output circuit 21, and then is transferred from the input/output circuit 21 to the register 42 and is stored.

The register 42 also stores status information indicating the operation status of the semiconductor storage device 2. The status information is updated by the sequencer 41 according to the operation status of the memory cell array 110. The status information is output as a status signal from the input/output circuit 21 to the memory controller 1 according to a request from the memory controller 1.

The voltage generation circuit 43 is a portion of generating a voltage required for each of a write operation, a read operation, and an erase operation of data in the memory cell array 110. Such a voltage includes, for example, a voltage to be applied to each word line WL or a voltage to be applied to each bit line BL. The operation of the voltage generation circuit 43 is controlled by the sequencer 41.

The voltage generation circuit 43 includes a protection circuit 44. The protection circuit 44 is a circuit provided to protect the semiconductor storage device 2 from a surge voltage such as static electricity that is applied from an external source.

The input/output pad group 31 includes a plurality of terminals (also referred to as pads) for transmitting/receiving each signal between the memory controller 1 and the input/output circuit 21. Each terminal is individually provided and corresponds to each of signals DQ<7:0>, and data strobe signals DQS and /DQS.

The logical control pad group 32 includes a plurality of terminals (pads) for transmitting/receiving each signal between the memory controller 1 and the logical control circuit 22. Each terminal is individually provided and corresponds to each of a chip enable signal /CE, a command latch enable signal CLE, an address latch enable signal ALE, a write enable signal /WE, read enable signals /RE and RE, a write protect signal /WP, and a ready busy signal /RB.

The power input terminal group 33 includes a plurality of terminals to which each voltage required for the operation of the semiconductor storage device 2 is to be applied. The voltages to be applied to the terminals, respectively, include power-supply voltages Vcc, VccQ, and Vpp, and a ground voltage Vss.

The power-supply voltage Vcc is a power-supply voltage that is given as an operating power source from the outside, and is, for example, a voltage of about 3.3 V. The power-supply voltage VccQ is, for example, a voltage of 1.2 V. The power-supply voltage VccQ is a voltage used in transmitting and receiving signals between the memory controller 1 and the semiconductor storage device 2. The power-supply voltage Vpp is a power-supply voltage higher than the power-supply voltage Vcc and is, for example, 12 V.

When data is written or data is erased into/from the memory cell array 110, a high voltage of about 20 V is required. It is possible to generate a desired voltage at a high speed and with low power consumption by boosting a power-supply voltage Vpp of about 12 V rather than boosting a power-supply voltage Vcc of about 3.3 V by a boosting circuit of the voltage generation circuit 43. When the semiconductor storage device 2 is used in an environment where a high voltage cannot be supplied, such that the power-supply voltage Vpp is not supplied. Even when the power-supply voltage Vpp is not supplied, the semiconductor storage device 2 may execute various operations as long as the power-supply voltage Vcc is supplied. That is, the power-supply voltage Vcc is a power source supplied to the semiconductor storage device 2 as a standard, and the power-supply voltage Vpp is a power source that is additionally and optionally supplied according to, for example, a usage environment.

Figure 7:
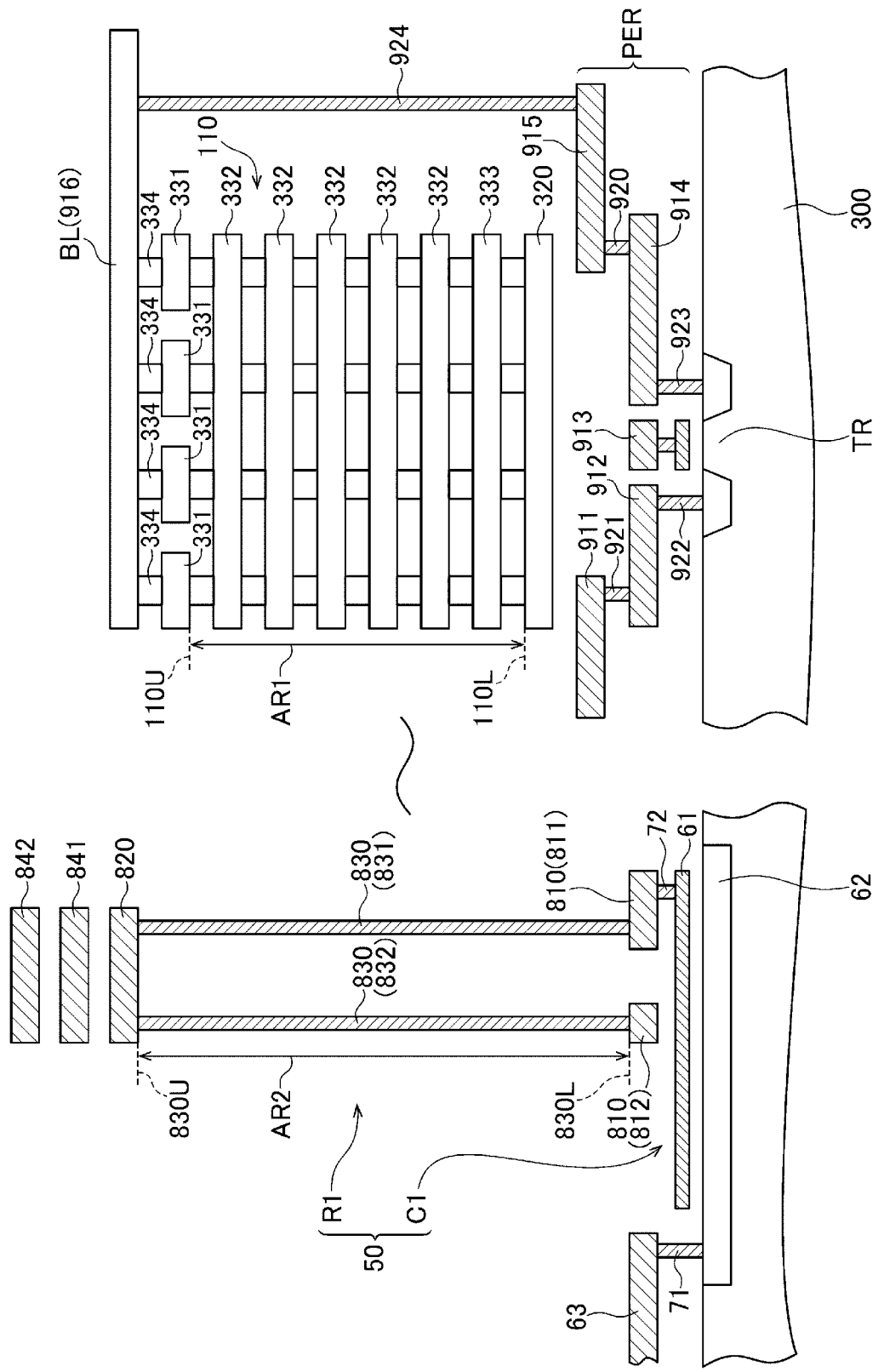
FIG. 7 is a view schematically illustrating the configuration of the semiconductor storage device, which includes the A-A cross section of FIG. 6.

As illustrated in FIG. 7, in the semiconductor storage device 2 according to the present embodiment, a peripheral circuit PER is provided below the memory cell array 110, that is, at a position between the memory cell array 110 and a semiconductor substrate 300. The peripheral circuit PER is a circuit provided to implement a write operation, a read operation, or an erase operation of data in the memory cell array 110. The sense amplifier 120, the row decoder 130, and the voltage generation circuit 43 illustrated in FIG. 2 are a part of the peripheral circuit PER. The peripheral circuit PER includes various transistors TR or a RC circuit 50.

Figure 5:
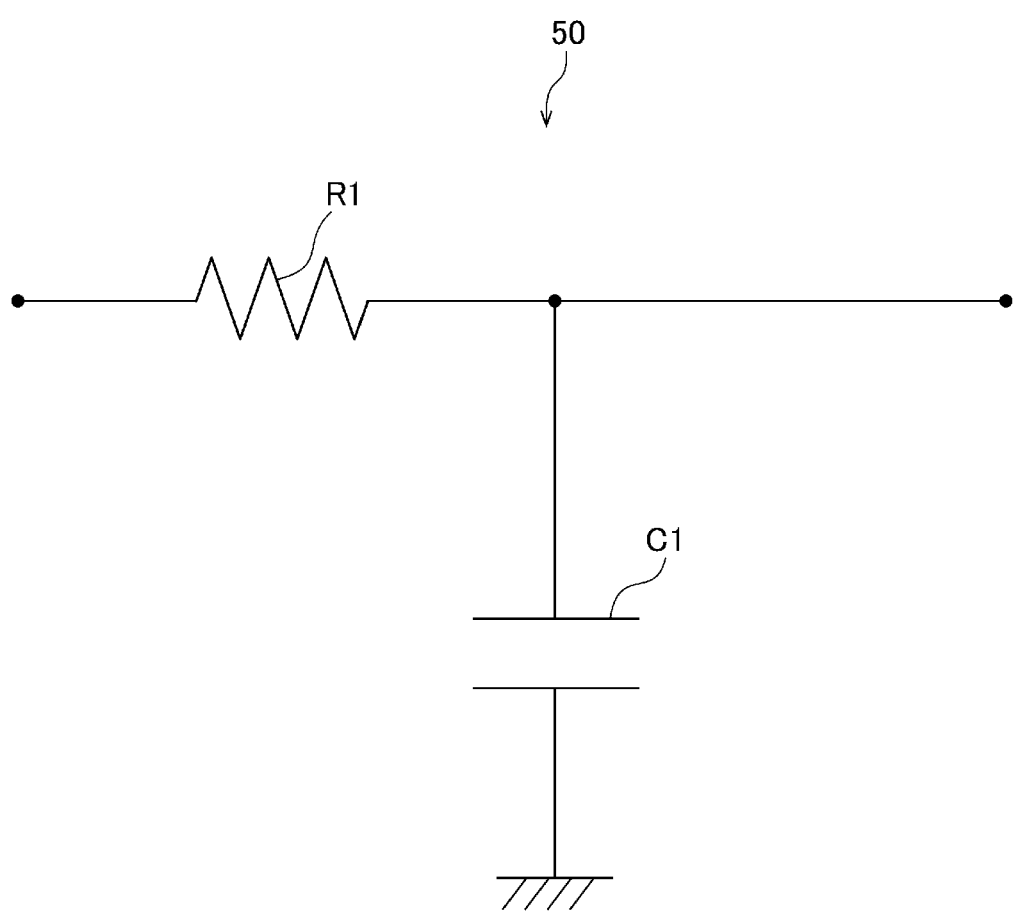
FIG. 5 is an equivalent circuit diagram illustrating the configuration of an RC circuit.

As illustrated in FIG. 5, the RC circuit 50 includes a resistive portion R1 and a capacitive portion C1 connected to each other. Such an RC circuit 50 functions as, for example, a lowpass filter, and is used to cause a specific node to have an attenuation characteristic. The resistive portion R1 is a circuit element configured such that the electrical resistance has a specific value, and the capacitive portion C1 is a circuit element configured such that the capacitance has a specific value. In the example of FIG. 5, the resistive portion R1 and the capacitive portion C1 are connected to each other in series, and a portion of the capacitive portion C1 opposite to the resistive portion R1 is grounded.

Figure 6:
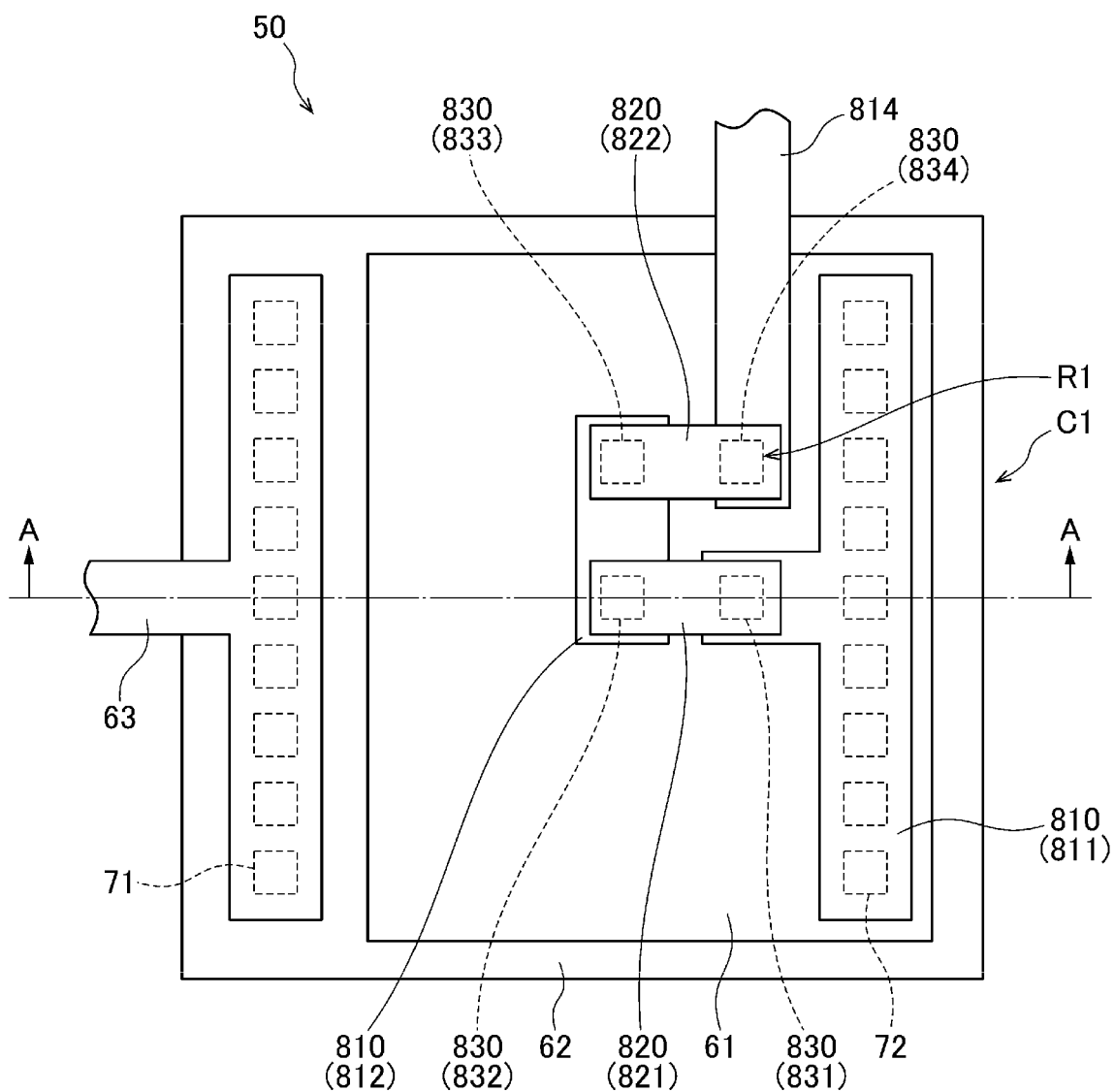
FIG. 6 is a view illustrating the configuration of the RC circuit.

In FIG. 6, the RC circuit 50 in the present embodiment is illustrated in a top view. FIG. 7 schematically illustrates the A-A cross section in FIG. 6, and the surrounding configuration thereof. As illustrated in FIG. 7, the RC circuit 50 is arranged in a region on the top surface side of the semiconductor substrate 300 different from that of the memory cell array 110.

As illustrated in FIG. 7, the semiconductor substrate 300 and the conductive layer 320 (corresponding to the source line SL) are separated from each other, and a part of the peripheral circuit PER is disposed between the two elements. The peripheral circuit PER includes transistors TR formed on the top surface of the semiconductor substrate 300, and a plurality of conductors 911 to 915. The conductors 911 to 915 are wiring layers formed of conductive material such as, for example, metal. The conductors 911 to 915 are formed to be distributed at a plurality of height positions, and are electrically connected to each other via contacts 920 to 923. The contacts 920 to 923 are formed by forming contact holes through an insulating layer (not illustrated) in the vertical direction, and filling the inside of the corresponding contact holes with, for example, a conductive material such as tungsten. The same also applies to contacts 71, 72, 830, and 924 to be described below.

The conductors 911 to 915 are wiring layers disposed below the memory cell array 110. Thus, these conductors 911 to 915 are also generally referred to as "lower layer side wiring layers."

The conductor 915 is a part of the lower layer side wiring layers and is electrically connected to a conductor 916 via the contact 924. The conductor 916 is a wiring layer functioning as, for example, the bit line BL. Also, similarly to the conductors 911 to 915, the conductor 916 may be a wiring layer formed of a conductive material such as, for example, metal. The height position of the conductor 916 may be a position different from that of the example of FIG. 7 as long as the position is equal to or higher than the upper end of the memory cell array 110. The conductor 916 is in the layer portion above the memory cell array 110, and is connected to, for example, any of terminals in the power input terminal group 33.

The conductor 916 is a wiring layer that is disposed above the memory cell array 110, together with conductors 841 and 842 to be described below. Thus, hereinafter, these conductors 916, 841, and 842 are also generally referred to as "upper layer side wiring layers."

In FIG. 7, the range of the memory cell array 110 in the vertical direction is indicated by the arrow AR1. An upper end 110U in the corresponding range is, for example, the position of the lower surface of the wiring layer 331 (corresponding to the select gate line SGD). A lower end 110L in the corresponding range is, for example, the position of the upper surface of the conductive layer 320 (corresponding to the source line SL).

The above-described lower layer side wiring layers are layers formed below the lower end 110L of the memory cell array 110. The upper layer side wiring layers are layers formed above the upper end 110U of the memory cell array 110. Therefore, the contact 924 is formed over a height range that extends from the lower end 110L of the memory cell array 110 to the upper end 110U.

The configuration of the RC circuit 50 will be described. As illustrated in FIG. 7, the RC circuit 50 is formed in a region on the top surface of the semiconductor substrate 300 different from that of the memory cell array 110. The RC circuit 50 is configured as a part of the peripheral circuit PER. A part of the RC circuit 50 extends to a height position above the lower side wiring layers.

As illustrated in FIG. 6 and FIG. 7, the capacitive portion C1 of the RC circuit 50 includes a first electrode 61 and a second electrode 62. The first electrode 61 and the second electrode 62 are a pair of electrodes which are disposed in the up-down direction while facing each other. As illustrated in FIG. 6, both the first electrode 61 and the second electrode 62 are rectangular in top view.

The second electrode 62 is an N-type diffusion layer formed on the top surface of the semiconductor substrate 300. The second electrode 62 is electrically connected to a third electrode 63 via the plurality of contacts 71. The third electrode 63 is a wiring formed as one of the lower side wiring layers. The third electrode 63 is grounded at, for example, a portion (not illustrated).

The first electrode 61 is formed at a position directly above the second electrode 62. The first electrode 61 is formed to have a smaller shape than the second electrode 62. In the top view as in FIG. 6, the entire first electrode 61 is formed in an area included in the second electrode 62. The first electrode 61 is formed of, for example, polysilicon.

The resistive portion R1 of the RC circuit 50 includes two lower conductors 810 (also labeled as 811 and 812), two upper conductors 820 (also labeled as 821 and 822), and four contacts 830 (also labeled as 831 to 834) in the present embodiment. All of these are formed of a material having conductivity such as, for example, metal. The lower conductors 810 and the upper conductors 820 are formed of, for example, the same material as the conductors 911 to 915. For such a material, for example, copper or aluminum may be used. The contacts 830 are formed of, for example, the same material as the contact 924. For such a material, for example, tungsten may be used.

Both of the two lower conductors 810 are disposed at a position below the lower end 110L of the memory cell array 110, and are formed as a part of the lower side wiring layers. Of the two lower conductors 810, the lower conductor 811 is electrically connected to the first electrode 61 of the capacitive portion C1 via a plurality of contacts 72.

The lower conductor 812, which is another of the two lower conductor 810, is disposed at the same height position as the lower conductor 811, and at a position separated from the lower conductor 811 in the top view.

Both of the two upper conductors 820 are disposed at a position above the upper end 110U of the memory cell array 110, and are formed as a part of the upper side wiring layers.

The upper side wiring layers include the conductors 841 and 842 disposed above the upper conductors 820. The conductors 841 and 842 are connected to the upper conductors 820 via, for example, contacts (not illustrated) and are connected to any of the terminals in the power input terminal group 33 via contacts (not illustrated). In the example of FIG. 7, the upper conductors 820 are disposed at a position on the lowermost side in the upper side wiring layers, and at the same height position as the bit line BL. However, the position of the upper conductors 820 may be different from this position.

Of the two upper conductors 820, the upper conductor 821 is electrically connected to the lower conductor 811 via the contact 831, and is electrically connected to the lower conductor 812 via the contact 832. All of the contacts 830, including the contacts 831 and 832 are conductors that extend in the vertical direction, similarly to the above-described contact 924.

The upper conductor 822 is another of the two upper conductors 820 and is disposed at the same height position as the upper conductor 821, and at a position separated from the upper conductor 821 in the top view. The upper conductor 822 is electrically connected to the lower conductor 812 via the contact 833, and is electrically connected to a conductor 814 via the contact 834. The conductor 814 is a wiring formed as one of the lower side wiring layers, and is disposed at, for example, the same height position as the lower conductors 810. The conductor 814 is connected to any of the terminals in the power input terminal group 33 via, for example, the contact 830, the upper conductor 820, the conductors 841 and 842, and contacts (not illustrated).

As described above, the lower conductor 811 is connected to the capacitive portion C1, and the conductor 814 is connected to another circuit element, and the lower conductor 811 and the conductor 814 are electrically connected to each other through the contacts 830 (831 to 834) that are electrically connected in series.

As illustrated in FIG. 7, all of the contacts 830 extend in elongated shapes in the vertical direction from the lower side wiring layers to the upper side wiring layers. Thus, the electrical resistance of each of the contacts 830 is larger than the electrical resistance of the lower conductor 810 or the upper conductor 820. As a result, the electrical resistance of the resistive portion R1 is substantially equal to the electrical resistances of all of the contacts 830 electrically connected in series. As described above, in the present embodiment, each of the contacts 830 is provided as a primary element for securing the electrical resistance in the resistive portion R1.

In the present embodiment, as in FIG. 6, when viewed along the vertical direction, the entire resistive portion R1, that is, all of the lower conductors 811 and 812, the upper conductors 821 and 822, and the contacts 831 to 834, is arranged in an area inside the area where the capacitive portion C1 is formed. The "area where the capacitive portion C1 is formed" mentioned herein is specifically an area within which a wider one of the first electrode 61 and the second electrode 62 (the second electrode 62 in the present embodiment) is formed.

Figure 8:
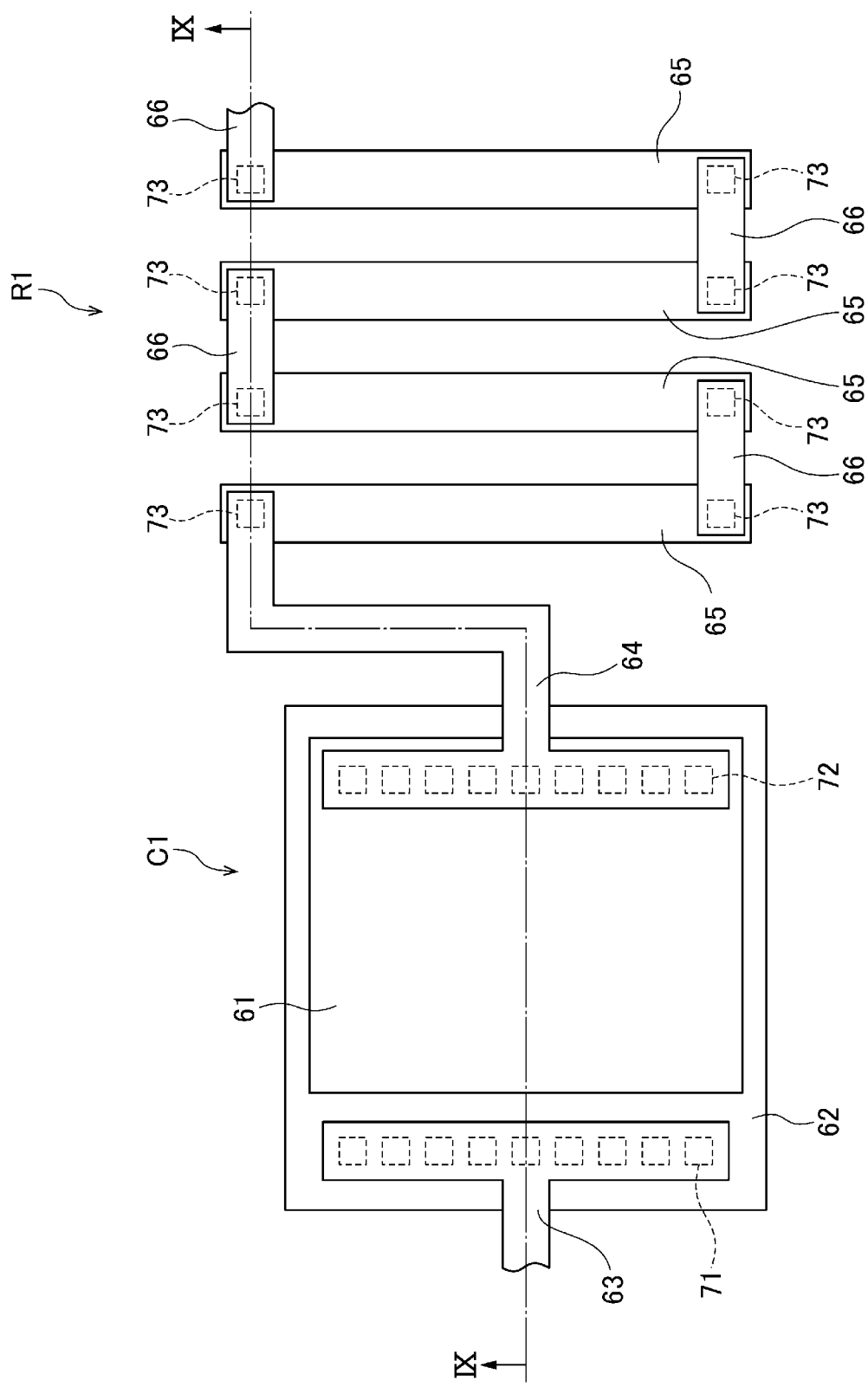
FIG. 8 is a view illustrating the configuration of an RC circuit of a semiconductor storage device according to a comparative example.
Figure 9:
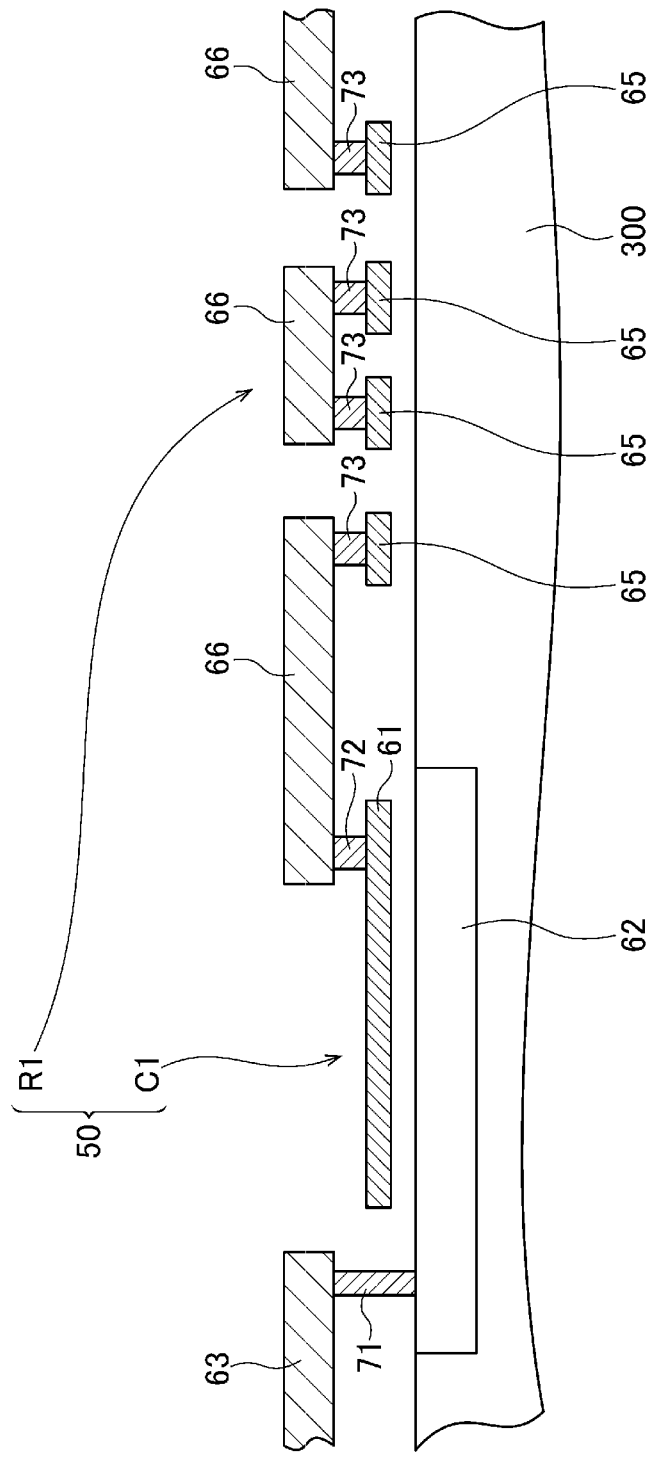
FIG. 9 is a view illustrating the IX-IX cross section of FIG. 8.

In FIG. 8, the configuration of the RC circuit 50 according to a comparative example is illustrated from the same viewpoint as that in FIG. 6. FIG. 9 illustrates the IX-IX cross section in FIG. 8.

As in the present embodiment, the RC circuit 50 according to the comparative example also has a configuration in which the resistive portion R1 and the capacitive portion C1 are connected to each other. The configuration of the capacitive portion C1 in the comparative example, which includes the third electrode 63 or the contacts 71, has the same configuration as the present embodiment. However, the configuration of the resistive portion R1 in the comparative example is different from the configuration of the resistive portion R1 in the present embodiment.

The resistive portion R1 in the comparative example includes a conductor 64, a plurality of resistive layers 65, a plurality of connection wirings 66, and a plurality of contacts 73. Among these, the conductors 64 and 66 and the contacts 73 are formed of a material having conductivity such as, for example, metal. The resistive layers 65 are formed of a material having a higher electrical resistance than the conductor 64, and are more specifically formed of, for example, the same material as polysilicon functioning as a gate of a transistor Tr.

Similarly to the lower conductor 811 in the present embodiment, the conductor 64 is electrically connected to the first electrode 61 of the capacitive portion C1 via the plurality of contacts 72. A part of the conductor 64 extends to a position outside the capacitive portion C1 in the top view. The leading end of the corresponding portion is electrically connected to the resistive layer 65 via the contact 73.

As described above, the resistive layer 65 is a layer formed of a material having a higher electrical resistance than the conductor 64. As for such a material, for example, polysilicon is used. The resistive layer 65 has a shape that extends linearly. For example, the resistive layers 65 are arranged parallel to each other. The resistive layers 65 are arranged to be spaced apart from each other in a direction perpendicular to the longitudinal direction thereof. The height position of each resistive layer 65 is a position slightly lower than the conductor 64.

The plurality of connection wirings 66 are disposed at the same height position as the conductor 64. The connection wiring 66 has a shape that extends linearly. The longitudinal direction of the connection wiring 66 is perpendicular to the longitudinal direction of the resistive layer 65. The end of each connection wiring 66 is electrically connected to the end of the resistive layer 65 via the contact 73. As illustrated in FIG. 8, the plurality of resistive layers 65 and the plurality of connection wirings 66 are connected in series in a state where they are alternately aligned, and at the end thereof, the resistive layer 65 arranged at the corresponding position is connected to the above-described conductor 64.

The electrical resistance of the resistive portion R1 according to comparative example is substantially equal to the electrical resistances of all of the resistive layers 65 electrically connected in series. As described above, in the comparative example, each of the resistive layers 65 is formed as a primary element for securing the electrical resistance in the resistive portion R1.

As described above, in the comparative example, the plurality of resistive layers 65 as primary elements for securing the electrical resistance in the resistive portion R1 are formed while extending along the top surface of the semiconductor substrate 300, and also are disposed at a position outside the range where the capacitive portion C1 is formed, in the top view. As a result, the resistive portion R1 and the capacitive portion C1 are arranged while lined up along the top surface of the semiconductor substrate 300. Thus, in the configuration of the comparative example, the RC circuit 50 occupies a relatively wide area. From the viewpoint of reducing the size of the semiconductor storage device 2, it is not desirable that the area of the RC circuit 50 becomes so wide in this manner. Therefore, in the present embodiment, the configuration of the RC circuit 50, especially, the resistive portion R1, is designed such that the RC circuit 50 is placed within a narrow area.

As described with reference to FIG. 6 and FIG. 7, in the RC circuit 50 of the semiconductor storage device 2 according to the present embodiment, the resistive portion R1 includes: the lower conductor 811; the upper conductor 821 disposed above the lower conductor 811; the contact 831 that extends upward from the lower conductor 811 and connects the lower conductor 811 to the upper conductor 821; and the contact 832 that extends downward from the upper conductor 821, and is not connected to the lower conductor 811. The contact 831 corresponds to a "first contact" in the present embodiment, and the contact 832 corresponds to a "second contact" in the present embodiment. When viewed along the vertical direction, the entire RC circuit 50 in the present embodiment, including other elements as well as those described above, is arranged inside the area where the capacitive portion C1 is formed.

In such a configuration, the area where the RC circuit 50 is formed is smaller than the area of the related art illustrated in FIG. 8. Accordingly, the overall size of the semiconductor storage device 2 may be made smaller than before.

In order to exhibit the above-described effect, it is most effective to arrange the entire resistive portion R1 inside the area where the capacitive portion C1 is formed. However, instead, only a part of the resistive portion R1, and not the whole thereof may be arranged inside the area where the capacitive portion C1 is formed. Specifically, the above-described effect of a size reduction can be exhibited as long as a couple of contacts 830 (i.e., the first contact and the second contact) connected to any one of the upper conductors 820 are arranged inside the area where the capacitive portion C1 is formed in the top view.

In FIG. 7, the extension range of the contact 830 in the vertical direction is indicated by the arrow AR2. An upper end 830U in this range is, for example, the position of the lower surface of the upper conductor 820. A lower end 830L in this range is the position of the upper surface of the lower conductor 810. In the present embodiment, the extension range of the contact 830 indicated by the arrow AR2 is a height range that includes the entire range of the memory cell array 110 indicated by the arrow AR1. That is, similarly to the contact 924, the contact 831 (hereinafter also referred to as the first contact) and the contact 832 (hereinafter also referred to as the second contact) in the present embodiment extend over a height range that extends from the lower end of the memory cell array 110 to the upper end.

In such a configuration, when the semiconductor storage device 2 is manufactured, it is possible to form both the contact 830 as a part of the RC circuit 50, and the contact 924 using the same method. Since the length of each contact 830 used as a resistor is secured, the electrical resistance of each contact 830 may be sufficiently increased.

The position of the upper end 830U of the contact 830 may be equal to or higher than the height position of the upper end 110U of the memory cell array 110. The position of the lower end 830L of the contact 830 may be equal to or lower than the height position of the lower end 110L of the memory cell array 110. For example, the contact 830 may be configured such that the contact 830 reaches from the height corresponding to the lower surface of the upper conductor 820, to the height corresponding to the upper surface of the lower conductor 810 via a conductor formed at the height position corresponding to the conductors 911 and 915.

As described with reference to FIG. 6, the resistive portion R1 of the present embodiment includes the two lower conductors 810 (811 and 812), the two upper conductors 820 (821 and 822), and the four contacts 830 (831 to 834). The number of elements included in the resistive portion R1 may be different from these. In any case, in the top view, only a part of the resistive portion R1, including the first contact and the second contact, has to be arranged inside the area where the capacitive portion C1 is formed. The number of the contacts 830 as resistors may be appropriately set according to the attenuation performance required for the RC circuit 50 such that the electrical resistance of the resistive portion R1 becomes an appropriate value.

The material of the contact 830 may also be properly selected according to the electrical resistance of the resistive portion R1 to be implemented. For example, each contact 830 may be formed by using polysilicon having a relatively high electrical resistance, as a material.

A second embodiment will be described. Hereinafter, points different from those in the first embodiment will be mainly described, and the same points as those in the first embodiment will be omitted in the description.

Figure 10:
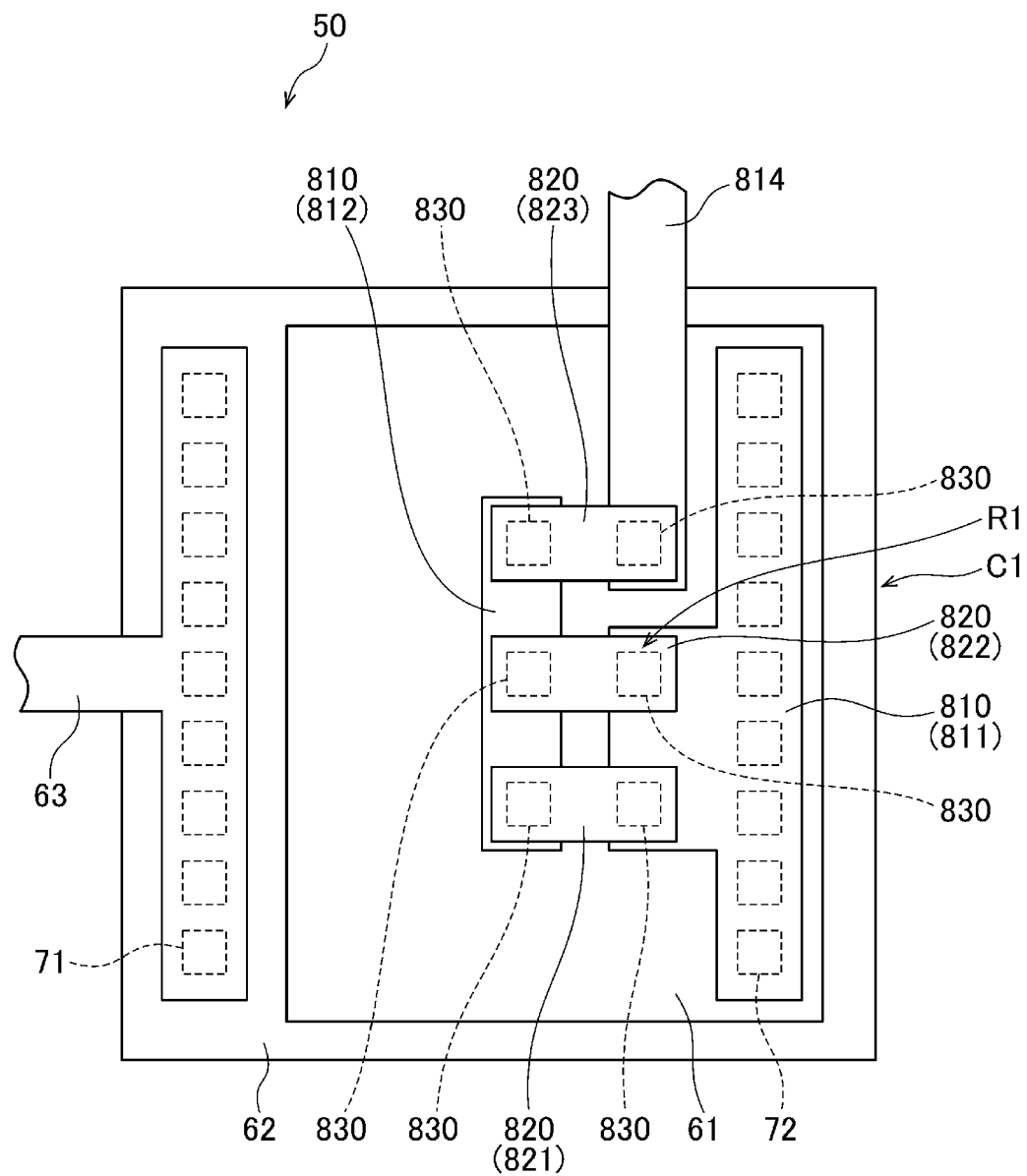
FIG. 10 is a view illustrating the configuration of an RC circuit included in a semiconductor storage device according to a second embodiment.

In FIG. 10, the configuration of the RC circuit 50 according to the present embodiment is illustrated from the same viewpoint as that in FIG. 6. As illustrated in FIG. 10, in the present embodiment, the resistive portion R1 of the RC circuit 50 includes three upper conductors 820 (821, 822, and 823). Among these, two upper conductors 821 and 822 are lined up parallel to each other while electrically connecting a lower conductor 811 to a lower conductor 812 via contacts 830. The other upper conductor 823 electrically connects the lower conductor 812 to a conductor 814 via the contacts 830. As a result, in the present embodiment, in a portion, the contacts 830 as resistors of the resistive portion R1 are connected to each other in series, whereas in another portion, the contacts 830 are connected parallel to each other. It is possible to adjust the overall resistance value of the resistive portion R1 by mixing a serial connection and a parallel connection. In such a configuration as well, the same effect as that described in the first embodiment is exhibited.

A third embodiment will be described. Hereinafter, points different from those in the first embodiment will be mainly described, and the same points as those in the first embodiment will be omitted in the description.

Figure 11:
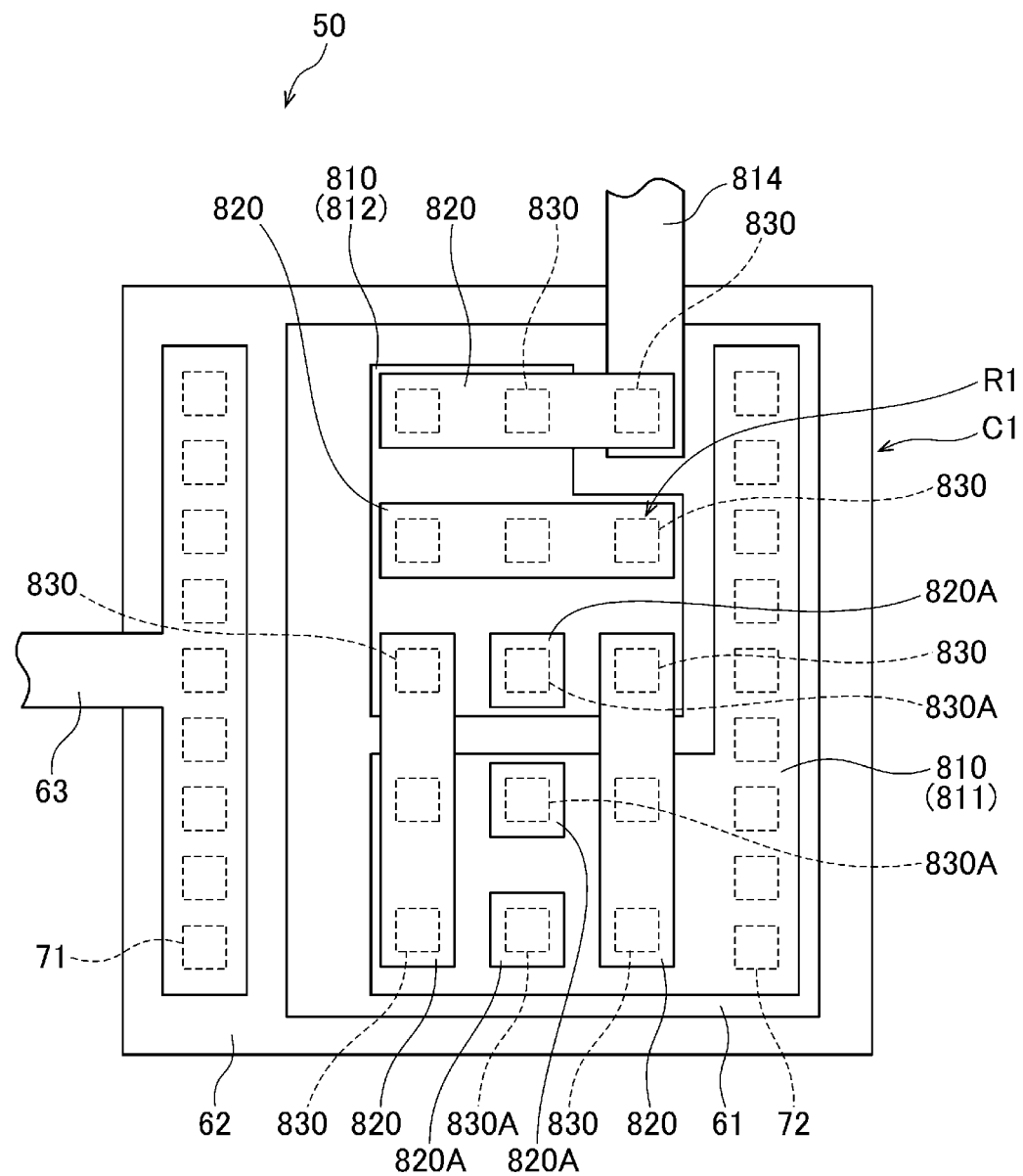
FIG. 11 is a view illustrating the configuration of an RC circuit included in a semiconductor storage device according to a third embodiment.

In FIG. 11, the configuration of the RC circuit 50 according to the present embodiment is illustrated from the same viewpoint as that in FIG. 6. As illustrated in FIG. 11, in the present embodiment, contacts 830 are arranged in a grid pattern of 3 columns x5 rows in the top view. In the present embodiment, a total of seven upper conductors 820 (and 820A) are provided, and each of the 15 contacts 830 aligned in the grid pattern as described above is connected to one of the seven upper conductors 820 from the lower side.

Instead of multiple contacts 830, only a single contact 830 is connected to the upper conductors 820 marked with the reference numeral "820A". Hereinafter, the upper conductor 820 to which only one contact 830 is connected in this manner will be also referred to as an "upper conductor 820A." Hereinafter, the contact 830 connected to the upper conductor 820A will be also referred to as a "contact 830A." The upper conductor 820A and the contact 830A do not form a path through which a current flows in the resistive portion R1. That is, these do not contribute to the electrical resistance of the resistive portion R1.

As described above, in the resistive portion R1 of the present embodiment, the contacts 830 including the first contact and the second contact similar to those in the first embodiment are arranged while aligned in the grid pattern when viewed along the vertical direction. In such a configuration, the contacts 830 are arranged to be uniformly distributed in a relatively wide area in the top view. That is, the configuration of the present embodiment becomes a configuration where a variation in the arrangement density of the contacts 830, depending on the locations, is suppressed as compared to that in the first embodiment. By adopting such a configuration, it is possible to manufacture the semiconductor storage device 2 including the RC circuit 50 relatively easily.

In the present embodiment, as described above, the plurality of contacts 830 includes one (i.e., the contact 830A) whose upper end is not connected to another contact 830 via the common upper conductor 820. That is, the upper end of at least one of the contacts 830 (the contact 830A) is not connected to the upper end of any of the other contacts 830. When all of the contacts 830 are arranged in the grid pattern in a state where such a contact 830A, or the upper conductor 820A connected thereto is present, it becomes possible to easily adjust the connection mode of the contacts 830 in, for example, designing the semiconductor storage device 2.

A fourth embodiment will be described. Hereinafter, points different from those in the first embodiment will be mainly described, and the same points as those in the first embodiment will be omitted in the description.

Figure 12:
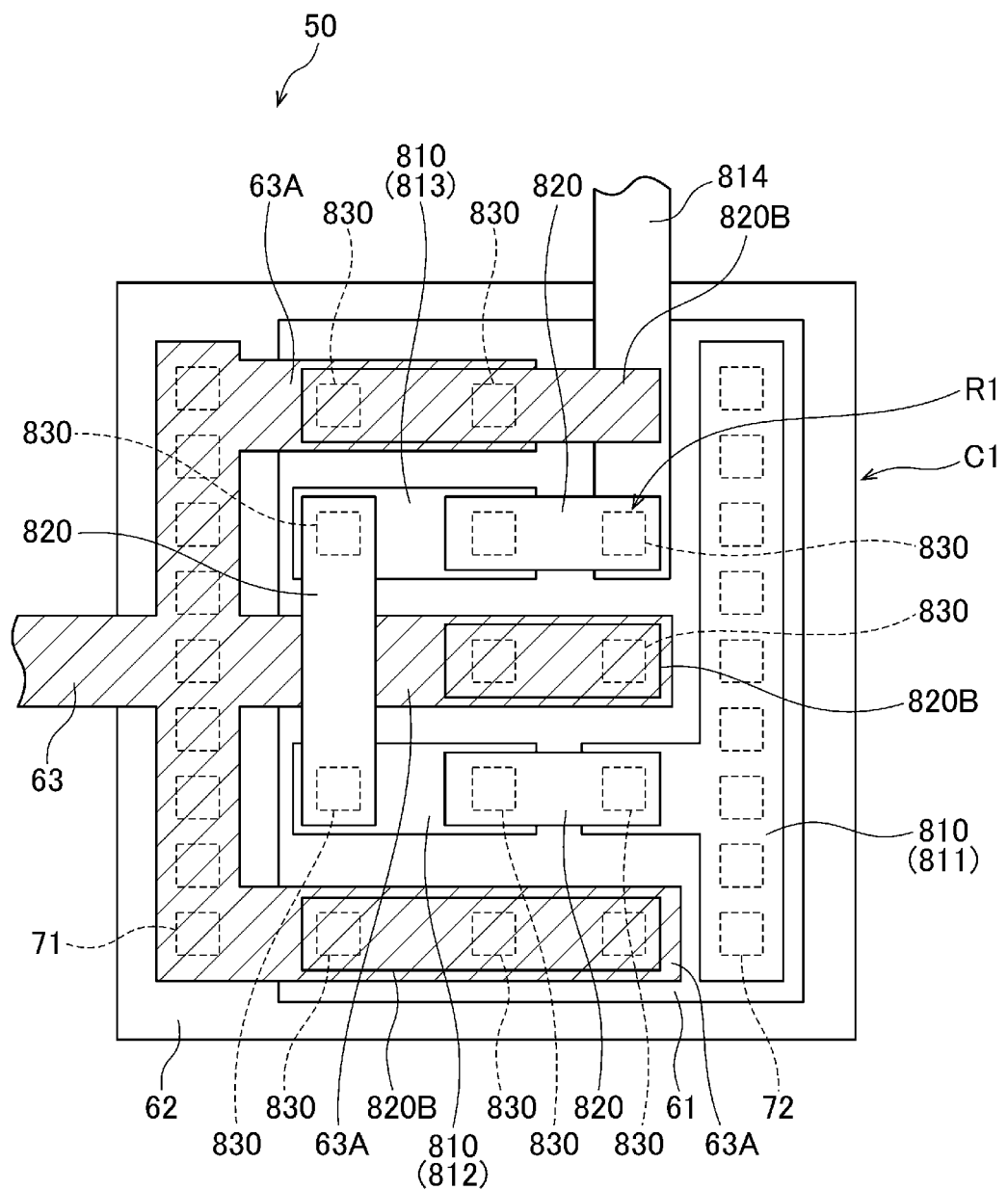
FIG. 12 is a view illustrating the configuration of an RC circuit included in a semiconductor storage device according to a fourth embodiment.

In FIG. 12, the configuration of the RC circuit 50 according to the present embodiment is illustrated from the same viewpoint as that in FIG. 6. As illustrated in FIG. 12, in the present embodiment, the resistive portion R1 of the RC circuit 50 includes three lower conductors 810 (811, 812, and 813) which are electrically connected to each other in series via contacts 830 and upper conductors 820.

In the present embodiment, a part of the third electrode 63 extends toward a direction where the resistive portion R1 is present (rightward in the example of FIG. 12). In FIG. 12, the portion extending in this manner is marked with the reference numeral "63A." The corresponding portion extends to a position close to the lower conductor 810, at the same height position as each lower conductor 810. Hereinafter, the portion marked with the reference numeral "63A" will be also referred to as an "extended portion 63A."

At a position directly above the extended portion 63A, an upper conductor 820B is arranged. The upper conductor 820B is arranged at the same height position as the upper conductor 820, and is formed of a material having conductivity such as, for example, metal. The upper conductor 820B is disposed at a position close to the upper conductor 820. Each upper conductor 820B and the extended portion 63A immediately below the corresponding upper conductor 820B are electrically connected to each other via the contacts 830.

In FIG. 12, the third electrode 63, including the extended portions 63A, and all of the upper conductors 820B connected to the third electrode 63 are hatched. Such hatched portions are close to the upper conductors 820 or the lower conductors 810 as primary members of the resistive portion R1, and thus a parasitic capacitance component is generated between the two. Also, a parasitic capacitance component is also generated between the hatched portions and the plurality of contacts 130 provided around the hatched portions. As a result, the value of the capacitance in the entire RC circuit 50 is increased as compared to that in the first embodiment.

In such a configuration, since it is possible to secure additional capacitance by generating the above-described parasitic capacitance component, the first electrode 61 or the second electrode 62 included in the capacitive portion C1 may be made smaller. Accordingly, it becomes possible to further reduce the size of the RC circuit 50.

A fifth embodiment will be described. Hereinafter, points different from those in the first embodiment will be mainly described, and the same points as those in the first embodiment will be omitted in the description.

Figure 13:
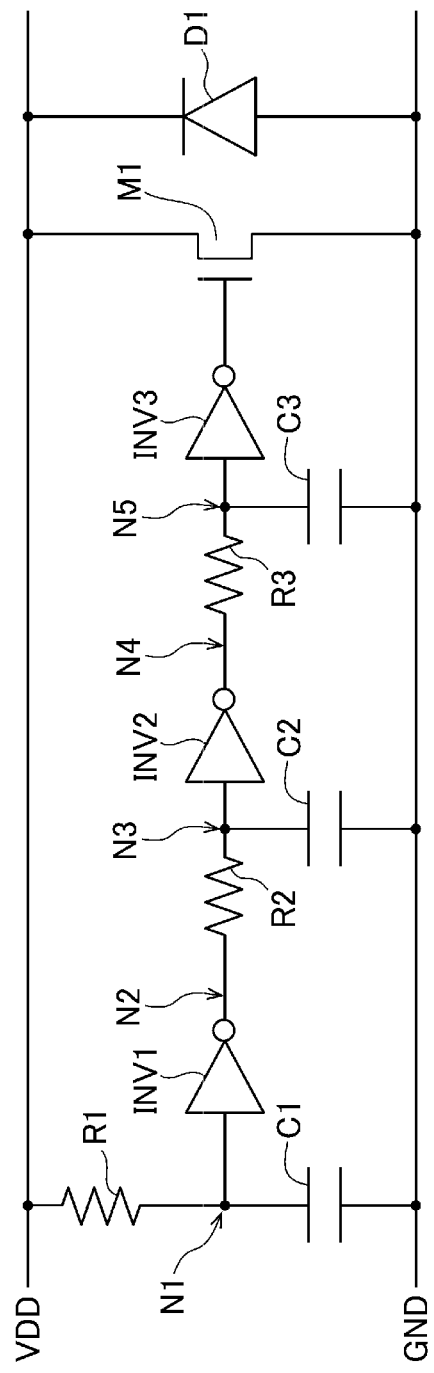
FIG. 13 is an equivalent circuit diagram illustrating the configuration of a protection circuit included in a semiconductor storage device according to a fifth embodiment.

The RC circuit related to the present embodiment is configured as a part of the protection circuit 44 illustrated in FIG. 2. The protection circuit 44 is a circuit for preventing damage caused by a surge voltage such as static electricity, and is referred to as, for example, an "ESD protection circuit." FIG. 13 illustrates the configuration of the protection circuit 44 in an equivalent circuit diagram. As illustrated in FIG. 13, the protection circuit 44 is provided between a power supply line VDD and a ground line GND, and includes resistive portions R1, R2, and R3, capacitive portions C1, C2, and C3, inverters INV1, INV2, and INV3, a MOS transistor M1, and a diode D1.

The resistive portion R1 connects the power supply line VDD to a node N1. The capacitive portion C1 connects the node N1 to a ground line GND. The node N1 is connected to an input terminal of the inverter INV1. The inverter INV1 is a logic inversion circuit that inverts an input signal and outputs the inverted input signal. The same also applies to the inverters INV2 and INV3 to be described below.

An output terminal of the inverter INV1 becomes a node N2. The resistive portion R2 connects the node N2 to a node N3. The capacitive portion C2 connects the node N3 to the ground line GND. The node N3 is connected to an input terminal of the inverter INV2.

An output terminal of the inverter INV2 becomes a node N4. The resistive portion R3 connects the node N4 to a node N5. The capacitive portion C3 connects the node N5 to the ground line GND. The node N5 is connected to an input terminal of the inverter INV3.

An output terminal of the inverter INV3 is connected to a gate of the MOS transistor M1. A drain of the MOS transistor M1 is connected to the power supply line VDD, and a source of the MOS transistor M1 is connected to the ground line GND. An anode of the diode D1 is connected to the ground line GND, and a cathode is connected to the power supply line VDD.

In the protection circuit 44 configured in this manner, the voltage level of the power supply line VDD is usually higher than the voltage level of the ground line GND, and the MOS transistor M1 is turned off. Thus, no current flows between the power supply line VDD and the ground line GND. However, in a state where the power supply line VDD and the ground line GND have the same voltage levels, for example, when the voltage of the power supply line VDD suddenly rises due to static electricity, the MOS transistor M1 is kept at the ON state for a while from that point in time, and a current flows from the power supply line VDD to the ground line GND. This prevents the voltage of the power supply line VDD from excessively rising and damaging elements of the peripheral circuit PER. After that, the MOS transistor M1 returns to an OFF state, and the voltage of the power supply line VDD is maintained at an appropriate value.

Figure 14:
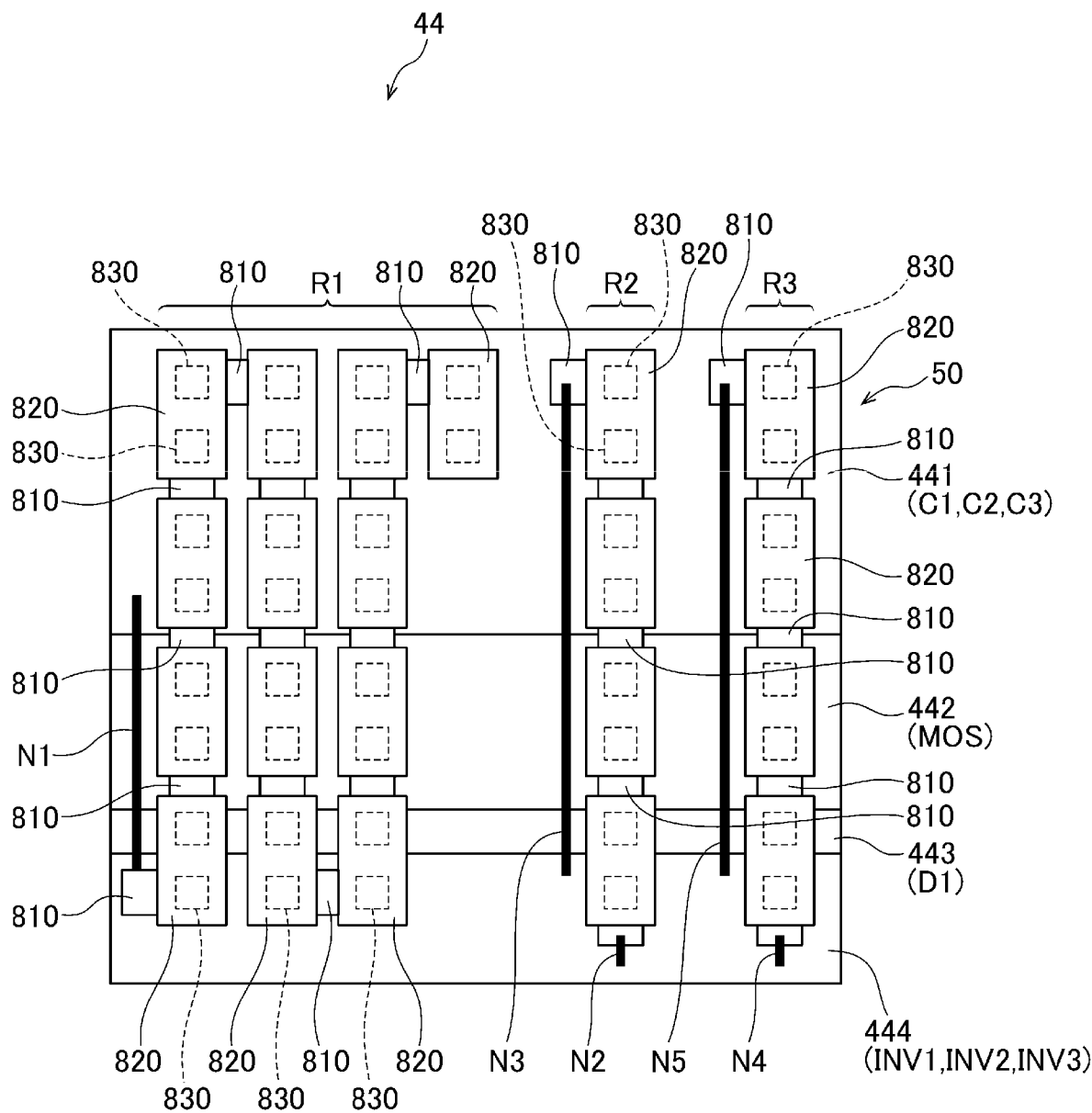
FIG. 14 is a view illustrating the configuration of the protection circuit included in the semiconductor storage device according to the fifth embodiment.

In FIG. 14, the top view of the configuration of the protection circuit 44 is schematically illustrated. As illustrated in FIG. 14, the protection circuit 44 includes four regions 441, 442, 443, and 444 adjacent to each other in the vertical direction in the top view of FIG. 14. The region 441 is a region where the capacitive portions C1, C2, and C3 are disposed. The region 442 is a region where the MOS transistor M1 is disposed. The region 443 is a region where the diode D1 is disposed. The region 444 is a region where the inverters INV1, INV2, and INV3 are disposed.

As illustrated in FIG. 14, all of the resistive portions R1, R2, and R3 included in the protection circuit 44 are arranged at positions directly above the regions 441, 442, 443, and 444, and inside all of these regions in the top view. In each of the resistive portions R1, R2, and R3, lower conductors 810 and upper conductors 820 are electrically connected via contacts 830 such that these are connected in series as a whole. The node N1 in FIG. 13 is a conductive layer formed at the same height position as the lower conductors 810, and extends from the region 441 to the region 444. In FIG. 14, such a node N1 is represented by a schematic straight line. Similarly to this, the nodes N2, N3, N4, and N5 in FIG. 13 are also represented by schematic straight lines in FIG. 14.

Figure 15:
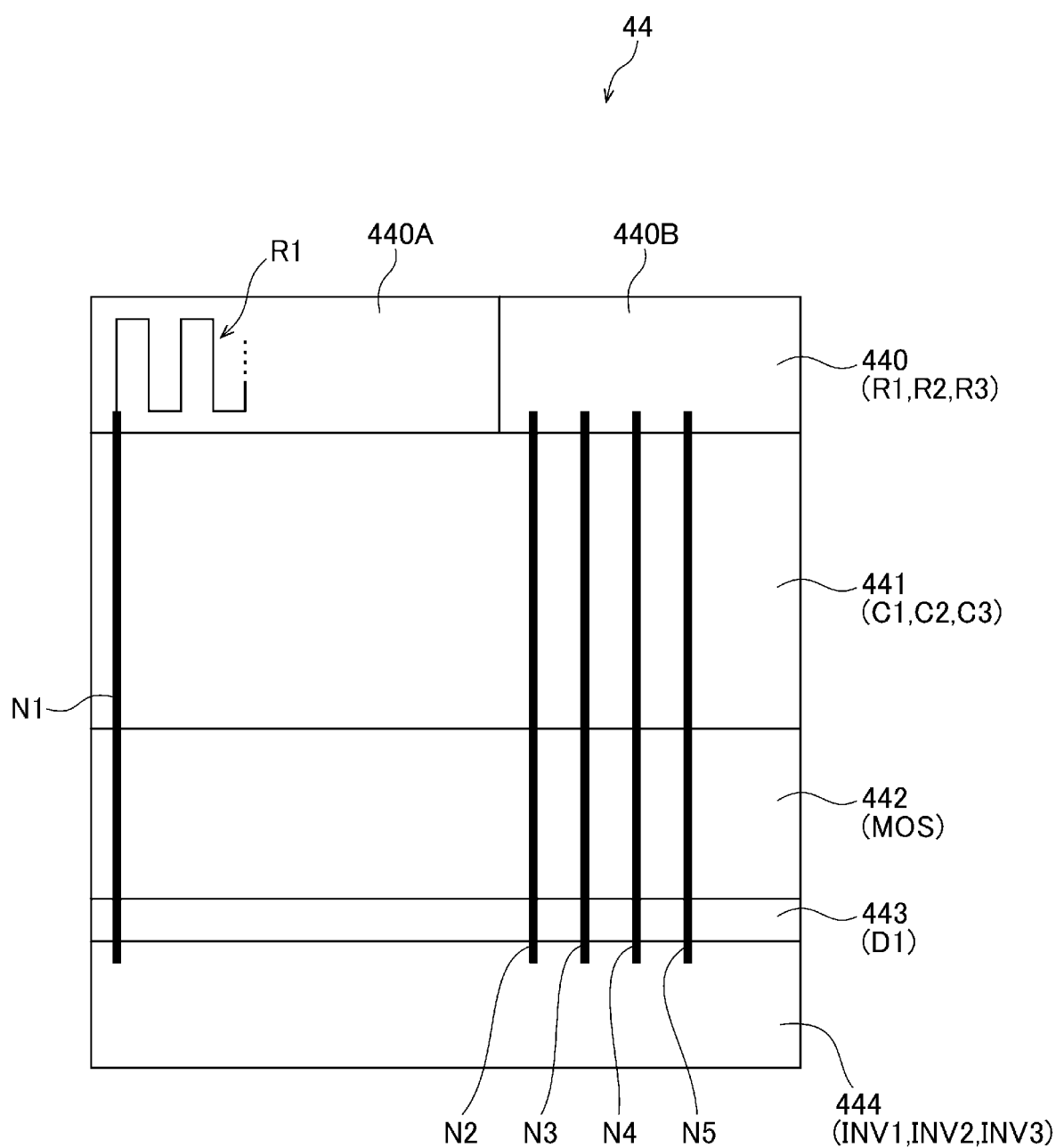
FIG. 15 is a view illustrating the configuration of a protection circuit included in a semiconductor storage device according to a comparative example.

FIG. 15 illustrates a configuration in a case where elements of the protection circuit 44 illustrated in FIG. 13 are arranged in the same manner as in the case of the related art, as a comparative example of the present embodiment. As illustrated in FIG. 15, in the comparative example, a region 440 is further included at a position adjacent to the region 441 in the vertical direction in the top view of FIG. 15. The region 440 is a region where the resistive portions R1, R2, and R3 are disposed. The region 440 includes a region 440A where the resistive portion R1 is disposed, and a region 440B where the resistive portions R2 and R3 are disposed. The region 440A and the region 440B are arranged at positions adjacent to each other in the left-right direction in the top view of FIG. 15.

In this comparative example, as in the example illustrated in FIG. 8, all of the resistive portions are formed outside the area where the capacitive portions are formed in the top view. In the resistive portions of comparative example, resistors (not illustrated) extend along the top surface of the semiconductor substrate 300, and are aligned along the corresponding top surface. Thus, in addition to the regions 441, 442, 443, and 444, the region 440 where the resistive portions R1, R2, and R3 are to be disposed is required. As a result, the area of the protection circuit 44 in the top view becomes relatively large.

Meanwhile, in the configuration of the present embodiment, as described with reference to FIG. 14, the resistive portions R1, R2, and R3 are arranged at positions directly above the regions 441, 442, 443, and 444, and inside all of these regions in the top view. That is, when viewed along the vertical direction, all of the resistive portions R1, R2, and R3 are arranged inside the area where the protection circuit 44 is formed. Through such a configuration, the necessity for forming the region 440 illustrated in FIG. 15 is eliminated, and the protection circuit 44 may be made smaller than before.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory cell array; and
a peripheral circuit disposed at least partially below the memory cell array,
wherein the peripheral circuit includes an RC circuit in which a resistive portion and a capacitive portion are electrically connected to each other in series,
wherein the resistive portion includes:
first and second lower conductors at a level that is below the memory cell array;
an upper conductor at a level that is above the memory cell array;
a first contact that extends upward from the first lower conductor, and connects the first lower conductor to the upper conductor; and
a second contact that extends downward from the upper conductor, and connects the upper conductor to the second lower conductor, and
wherein the first lower conductor, the first contact, the upper conductor, the second contact, and the second lower conductor are electrically connected in series in this order and the first lower conductor is closest to the capacitive portion along a current path formed by the capacitive portion and the resistive portion.

2. The semiconductor storage device according to claim 1, wherein
the first contact and the second contact are arranged within an area where the capacitive portion is formed, when viewed along a vertical direction.

3. The semiconductor storage device according to claim 1, wherein an extension length of the first contact and the second contact is greater than a distance from a lower end of the memory cell array to an upper end of the memory cell array.

4. The semiconductor storage device according to claim 1, wherein a plurality of contacts including the first contact and the second contact are arranged in a grid pattern when viewed along a vertical direction.

5. The semiconductor storage device according to claim 4, wherein an upper end of at least one of the contacts is not electrically connected to an upper end of another one of the contacts.

6. The semiconductor storage device according to claim 1, wherein the resistive portion is arranged entirely within an area where the capacitive portion is formed, when viewed along a vertical direction.

7. The semiconductor storage device according to claim 1, wherein
the peripheral circuit includes a protection circuit for preventing damage caused by static electricity, and
the RC circuit is a part of the protection circuit.

8. The semiconductor storage device according to claim 7, wherein
the resistive portion is arranged entirely within an area where the protection circuit is formed, when viewed along a vertical direction.

9. The semiconductor storage device according to claim 1, wherein the capacitive portion includes a first planar electrode connected to the resistive portion, and a second planar electrode that faces the first electrode.

10. The semiconductor storage device according to claim 9, wherein
a part of a third electrode that is electrically connected between ground and the second electrode extends to a position that is directly above the first planar electrode and toward the first lower conductor.

11. A semiconductor storage device comprising:
a memory cell array; and
a peripheral circuit disposed at least partially below the memory cell array and including an RC circuit having a resistive portion and capacitive portion electrically connected in series, the capacitive portion including a first electrode connected to the resistive portion and a second electrode facing the first electrode and connected to ground, wherein the resistive portion includes:

a plurality of lower conductors at a level that is below the memory cell array;

a plurality of upper conductors at a level that is above the memory cell array; and a plurality of contacts, each extending vertically from one of the lower conductors to one of the upper conductors to electrically connect the lower conductors and the upper conductors in series between a first end of the resistive portion to a second end of the resistive portion that is connected to the first electrode of the capacitive portion.

12. The semiconductor storage device according to claim 11, wherein the contacts are formed of a first material and the lower and upper conductors are formed of a second material having a lower electrical resistivity than that of the first material.

13. The semiconductor storage device according to claim 12, wherein the contacts are formed of polysilicon.

14. The semiconductor storage device according to claim 11, wherein an extension length of each of the contacts is greater than a distance from a lower end of the memory cell array to an upper end of the memory cell array.

15. The semiconductor storage device according to claim 11, wherein all of the contacts are directly above the capacitive portion.

16. The semiconductor storage device according to claim 11, further comprising:

a plurality of other upper electrodes; and a plurality of other contacts, each extending vertically from one of the lower electrodes to one of the other upper electrodes, wherein the contacts and the other contacts are arranged in a grid when viewed along a vertical direction.

17. The semiconductor storage device according to claim 11, wherein the peripheral circuit includes a protection circuit for preventing damage caused by static electricity, and the RC circuit is a part of the protection circuit.

18. The semiconductor storage device according to claim 17, wherein the resistive portion is arranged entirely within an area where the protection circuit is formed.

\* \* \* \* \*